United States Patent
Yoshino et al.

(10) Patent No.: US 6,338,872 B1
(45) Date of Patent: Jan. 15, 2002

(54) FILM FORMING METHOD

(75) Inventors: Takehito Yoshino, Nara; Hiroshi Echizen, Nagahama; Masahiro Kanai, Kyoto; Hirokazu Otoshi, Nara; Atsushi Yasuno, Nagahama; Kohei Yoshida; Koichiro Moriyama, both of Kyoto; Masatoshi Tanaka, Nagahama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/337,557

(22) Filed: Jun. 22, 1999

Related U.S. Application Data

(62) Division of application No. 08/704,138, filed on Aug. 28, 1996.

(30) Foreign Application Priority Data

Aug. 28, 1995 (JP) ............................... 7-242464
Jan. 16, 1996 (JP) ............................... 8-023093
Jan. 16, 1996 (JP) ............................... 8-023096

(51) Int. Cl.[7] ......................... C23C 16/00; H01L 21/00; H01L 21/02

(52) U.S. Cl. ................... 427/248.1; 427/58; 427/74; 427/255.5; 427/255.7; 438/47; 438/61; 438/62; 118/715; 118/718

(58) Field of Search ................... 427/74, 127, 128, 427/131, 177, 178, 255.5, 294, 295, 471, 508; 118/718, 723, 730; 204/298

(56) References Cited

U.S. PATENT DOCUMENTS 4,666,734 A * 5/1987 Kamyia et al. ............... 427/39
5,266,116 A * 11/1993 Fujioka et al. ............... 118/718

* cited by examiner

Primary Examiner—Shrive Beck
Assistant Examiner—William P. Fletcher, III
(74) Attorney, Agent, or Firm—Fitzpatrick, Cella, Harper & Scinto

(57) ABSTRACT

A film forming method is described using an apparatus with a plurality of vacuum chambers which communicate with each other via a connection, where the apparatus has one or more detachable treatment rooms and where the method includes continuously forming a plurality of films on a band-shaped substrate within the treatment rooms, while continuously moving the substrate through the treatment rooms. The treatment rooms within said desired vacuum chambers are replaced after forming the film for a predetermined period as a part of the film forming method.

2 Claims, 14 Drawing Sheets

ENLARGED VIEW OF SECTION A

FILM FORMING METHOD

This application is a division of application Ser. No. 08/704,138, filed Aug. 28, 1996.

BACKGROUND OF THE INVENTION

1. Field of the Invention

The present invention relates to a film forming apparatus and method for forming functional deposited films for photovoltaic elements or various kinds of sensors. More particularly, the invention relates to an improved film forming apparatus and method in which the maintenance time for continuous film formation such as a roll-to-roll film formation is shortened to enhance the working efficiency of the apparatus.

2. Related Background Art

A variety of semiconductor devices or electronic devices including photovoltaic elements or various kinds of sensors are provided with one or more functional deposited films on a substrate. In a manufacturing process of such devices, it is desired to form the deposited films as having certain level of characteristics continuously and efficiently to mass produce the products of superior characteristics.

For example, in a photovoltaic element such as a solar cell of the structure in which a plurality of semiconductor layers (i-layer, n-layer, p-layer) are laminated, various examinations for the stable film forming process have been made to enhance its function.

In recent years, a power generation system with a solar battery using the sunlight has drawn attention as a clean power generation system which can cope with increased demands for electric power in the future, without causing environmental destruction, since it does not bring about problems of radioactive pollution or global warming, uses a less maldistributed energy source, and further can accomplish a relatively high efficiency of power generation without needing complex and large installations. Various activities of research and development have been made for practical use of such a battery.

To establish the power generation system using the solar battery as meeting the demands for electric power, it is fundamentally required that the solar battery has a high enough photoelectric conversion efficiency, stable characteristics, and is capable of mass production.

In this respect, a solar battery which can be fabricated, using a source gas such as silane, in a gaseous body, which is easily available, by depositing a semiconductor film of e.g. amorphous silicon (hereinafter abbreviated as "a-Si") on a relatively inexpensive substrate made of glass or metal, has been noted, such a battery is suited for mass production, with the possibility of lower production costs, as compared with the solar battery fabricated using a single crystal silicon. Various proposals have been made for the constitution of basic layers and the manufacturing methods thereof.

Although a-Si deposited film is formed on a band-like substrate by chemical vapor deposition (CVD) which typically occurs from the gas phase under reduced pressures, or sputtering, a plasma CVD method making use of glow discharge plasma is widely utilized because the characteristics of the deposited film are superior, and can be mass produced.

Recently, a plasma process making use of microwave has been also noted. The microwave, which is short in frequency band, can have a higher energy density than when using RF, and thus is suited for generating and sustaining plasma efficiently.

For example, in U.S. Pat. Nos. 4,517,223 and 4,504,518, a method of depositing a thin film on a substrate of small area within microwave glow discharge plasma under low pressures has been disclosed. With this method, since the film formation can be made via a process under low pressures, high quality deposited films can be produced by preventing polymerization of active species which may cause degraded film characteristics. In forming an Si film, the film forming speed can be remarkably increased, while generation of polymers such as polysilane in plasma is suppressed.

However, in microwave plasma, though much higher film forming speed may be typically expected, microwave applicator means making use of a microwave generator, an isolator, a waveguide, and an arsela ceramics window is needed to introduce microwave into a film forming chamber, resulting in higher costs than the conventional RF methods. Accordingly, for example, in the formation of a-Si film in manufacturing the a-Si solar cell, the microwave is used for fabrication of a photovoltaic layer (i-type a-Si layer) having large film thickness for which high throughput is required, while the RF method is used for making other layers, i.e., n-type a-Si layer and p-type a-Si layer. A so-called hybrid method has thus been proposed.

On the other hand, from the viewpoint of a film formation process, and in consideration of mass production of final devices, a continuous plasma CVD system which adopts a roll-to-roll (Roll to Roll) type substrate which is wound like a roll has been disclosed in U.S. Pat. No. 4,400,409.

With this apparatus, a plurality of glow discharge regions are provided, a flexible substrate having a desired width and a sufficient length is laid along a path extending through the glow discharge regions, through which the substrate is passed successively. A semiconductor layer of the required conduction type is deposited in the glow discharge regions, while the substrate is conveyed continuously in a longitudinal direction, to allow for the continuous formation of elements having semiconductor junctions.

Note that in U.S. Pat. No. 4,400,409, a gas gate was used to prevent dopant gas for use in forming each semiconductor layer from diffusing and mixing into other glow discharge regions. Specifically, the glow discharge regions are separated from one another by a slit-like separation passage, and the separation passage is provided with means for forming the flow of scavenging gas such as Ar or $H_2$. In this respect, it can be said that the roll-to-roll type is suitable for mass production of semiconductor devices in which various functional films are laminated.

In addition, a continuous plasma CVD system of roll-to-roll type for forming a large area a-Si deposited film was disclosed in U.S. Pat. No. 4,485,125.

For a plasma process using microwave, a deposited film forming method and apparatus of roll-to-roll type using a microwave plasma CVD system was disclosed, for example, in Japanese Laid-Open Patent Application No. 3-30419.

A typical plasma CVD system of roll-to-roll type will be described below with reference to the drawings.

FIG. 1 is a cross-sectional view showing the constitution of the plasma CVD system of roll-to-roll type, and FIG. 2 is a cross-sectional view showing the constitution of a vacuum vessel (chamber) and a film forming chamber which are contained in the apparatus. In FIG. 1, 500 to 504 are vacuum vessels (chambers), 505 to 507 are film forming chambers, 508 to 510 are discharge electrodes, 511 to 513 are glow discharge spaces, 514 to 516 are rf oscillators, 517 to 519 are substrate heaters, 520 to 522 are gas heaters, 523 to 525 are source gas inlet ports, 526 is a magnet roller, 527 to 530 are gas gates, 531 to 533 are exhaust pumps, 534 to 535 are pressure gauges, 537 to 540 are gate gas inlet ports, 541 is a delivery bobbin, 542 is a winding bobbin, and 543 to 545 are gas gate exhaust ports.

FIG. 2 is a cross-sectional view of the apparatus (one vacuum vessel) as seen from the side. The prismatic vacuum vessels 500 to 504 are arranged on a straight line as viewed from the upper face, or like a catenary as viewed from the lateral side. The substrate for forming the film thereon is a band-like substrate 100 having a desired width and a sufficient length.

Provided inside the vacuum vessels 501 to 503 are film forming chambers 505 to 507, respectively, in which desired semiconductor layers are formed on the band-like substrate 100 within the glow discharge spaces 511 to 513 which are enclosed by the band-like substrate 100, the discharge electrodes 508 to 510, and the film forming chambers 505 to 507.

In FIG. 1, a vacuum vessel 500 at the left end as shown contains the delivery bobbin 541 for the band-like substrate 100, and a vacuum vessel 503 at the right end as shown contains the winding bobbin 542.

The band-like substrate 100 extending lengthwise as a band is made of a material having electrical conductivity, flexibility and magnetism such as stainless steel, is delivered from the delivery bobbin 541 to pass through the vacuum vessels 501 to 503 and the film forming chambers 505 to 507, in succession, and wound around the winding bobbin 542.

On a conveyance passageway of the band-like substrate 100, there are disposed a plurality of magnet rollers 526 at appropriate locations thereof, which are magnetized and rotatable, to support the band-like substrate by magnetic suction to retain a predetermined conveyance passageway.

In FIG. 1, the film forming chambers 505 to 507 are connected to exhaust pumps 531 to 533 having an exhaust speed regulating function, to keep the inside of film forming chambers at desired pressures by measuring the pressure by means of the pressure gauges 534 to 536, and controlling the exhaust speed of the exhaust pumps 531 to 533 by means of a pressure control device (not shown).

A plurality of different kinds of source gases are mixed into desired constituents by means of a gas mixer (not shown), and this mixed gas is fed through source gas inlet ports 523 to 525 into the film forming chambers. Also, the vacuum vessels are connected via the gas gates 527 to 530, respectively, which have both functions of preventing mutual diffusion of source gases of adjacent vacuum vessels by isolating them, and passing the band-like substrate 100 therethrough.

A gas isolating function can be fulfilled by connecting adjacent vacuum vessels via a slit-like separation passageway, and flowing a separation gas (gate gas) from the upper and lower faces of the gas gate to collide with the source gas to shorten the diffusion length of the source gas.

Examples of the gate gas include $H_2$, He and Ar. The exhaust pipes connected to the film forming chambers 505 to 507 are provided with the gate gas exhaust ports 543 to 545, respectively, whereby the source gases or decomposed gases which flow out of the glow discharge spaces 511 to 513 are exhausted from the gate gas exhaust ports 543 to 545, together with the gate gas, to prevent the gate gas and the mixed gases from adjacent vacuum vessels from entering the glow discharge spaces.

The above-described constitution of the apparatus of a double chamber structure having vacuum vessels and film forming chambers, with a gas gate provided between adjacent vacuum vessels, is an important technique for the plasma roll-to-roll type CVD system.

Even if the band-like substrate 100 is moved into a next vacuum vessel, the source gas within the vacuum vessel is not transferred. Further, even if there is any pressure difference within each vacuum vessel, mutual diffusion or mixture of source gases between adjacent vacuum vessels can be suppressed to a minimum, so that the semiconductor layers of desired conduction type having excellent characteristics can be deposited in succession on the band-like substrate 100.

Referring now to FIG. 2, the internal structure of vacuum vessels 501 to 503 containing the film forming chambers 505 to 507 of FIG. 1 will be described below.

In FIG. 2, 700 is a film forming chamber, 701 is a feeder board, 702 is a shield, 703 is an rf introducing flange, 704 is a gas introducing flange, 705 is a gas introducing tube, 706 is a film forming chamber stay, 100 is a band-like substrate, 101 is a vacuum vessel, 102 is a ceiling plate, 104 is a discharge electrode, 105 is a guard electrode, 110 to 112 are insulators, 113 is a substrate heater, 114 is a gas heater, 115 is a heater supporting stay, and 118 is a glow discharge space.

In FIG. 2, RF power from the rf oscillator (not shown) is supplied via the rf introducing flange 703, and the feeder board 701, to the discharge electrode 104. Also, the source gas is supplied via the gas introducing flange 704 into the film forming chamber 700.

In FIG. 2, a space enclosed by the film forming chamber 700, the band-like substrate 100, the ceiling plate 102 and the discharge electrode 104 is the glow discharge space 118.

By decomposing the source gas introduced into the glow discharge space 118 with RF power applied to the discharge electrode 104, the semiconductor deposited film of desired conduction type can be formed on the band-like substrate 100. The ceiling plate 102 is attached to the film forming chamber 700, to form an upper lid of the film forming chamber 700, along with the band-like substrate 100.

Also, on the back face side of the band-like substrate 100, the heater 113 is provided to heat the band-like substrate 100 to a proper substrate temperature. The source gas is heated by the gas heater 114, and fed into the glow discharge space 118. Also, the gas heater 114 heats the film forming chamber 700, the discharge electrode 104 and the guard electrode 105.

Heating of these has the effect of preventing the powder of polysilane produced by decomposition of the source gas from depositing on the wall face of film forming chamber 700 as well as the surface of discharge electrode 104.

In order to form the film to be deposited on the band-like substrate 100, with good controllability and reproducibility, it is requisite to introduce the RF power and the film forming gas into the film forming chamber 700 without leakage.

For example, to keep the RF power from leaking from the shield 702, it is desired that the shield 702 is rigidly attached to a bottom face of vacuum vessel 101 without clearance, and that the feeder board 701 is made of copper having a high electrical conductivity.

However, because copper has also a high thermal conductivity, the feeder board 701 will be heated by thermal conduction from the discharge electrode 104 heated by plasma of the glow discharge space 118 and the gas heater 114.

It is necessary to provide such a design that the feeder board 701 having caused thermal expansion does not make contact with the shield 702 by deformation.

Further, it is necessary to provide such a design that the source gas is introduced into the film forming chamber 700, and may not leak into the vacuum vessel 101 except for the film forming chamber 700. From the above reasons, the use of a bellows-like flexible mechanism for the feeder board 701, the shield 702, and the gas introducing tube 705 may be considered. However, this mechanism may possibly cause breakage due to changes with the lapse of time. In an apparatus which will operate long term as a production machine, because it is important to have reproducibility and reliability, the feeder board 701, the shield 702 and the gas introducing tube 705 are desirably in the form of a durable rod.

The operation of the plasma CVD system of roll-to-roll type will be schematically described in the following. In FIG. 1, if the plasma CVD system is activated, the land-like substrate 100 delivered from the delivery bobbin 541 is continuously conveyed in a longitudinal direction thereof at a constant rate, passed through the film forming chambers 505 to 507 to form desired semiconductor layers in succession on the band-like substrate 100 within the glow discharge spaces 511 to 513, and then wound around the winding bobbin 542.

Finally, a plurality of sorts of semiconductor layers are laid down on the band-like substrate 100 to continuously form desired semiconductor junction devices. As a result, the semiconductor junction devices of large area can be mass-produced.

The apparatus as shown in FIG. 1 is a plasma CVD system of roll-to-roll type to form a photovoltaic element having one pin structure, i.e., a single cell, if applied to the manufacture of photovoltaic element. However, this apparatus is able to form a so-called triple cell having a pin-pin-pin structure with enhanced photoelectric conversion efficiency, if more film forming chambers are connected.

Generally, the whole size of the apparatus may be different depending on the production throughput, but the apparatus having the capability of producing photoelectric elements of triple type which generate about 10 MW of optical power for one year has approximately 20 film forming chambers, with the overall length of apparatus being about 40 m in a longitudinal direction.

In view of an example of the film forming process for a photovoltaic element such as a solar cell, as above described, fabrication of devices having multiple functional films can be applied as a mass production method having a greater throughput by reasonably combining a continuous film forming system such as roll-to-roll production as above described with various film forming processes. However, in such a mass production system which is considered to be ideal, the following problems arose.

Active species, precursors for forming the deposited film, may deposit on some regions of the film forming chamber other than the substrate of interest in the form of powder or film.

Such film deposited on some regions other than the substrate may be exfoliated from the bottom, beyond a certain limit of thickness. Some exfoliated film pieces may stick to the substrate, yielding defective portions on the deposited film. To prevent such a situation, cleaning the film forming chamber every time a certain number of film formations is reached, or the total time of film formation is exceeded. However, it takes considerable time to clean away the powder or film. For example, if using a file or brush to take off the film, more time and labor was required, and the small portion not easily accessible was difficult to clean. Also, in the case of powder, there was a risk of causing a fire.

Accordingly, a cleaning method in which only an easily detachable portion within the film forming chamber is removed, and reused by etching or blasting for regeneration.

Even with this method, it took much time to perform mounting or dismounting of individual parts, assembling, and the etching process, resulting in reduced availability of the apparatus.

A further problem, when using the roll-to-roll type apparatus, is handling of the band-like substrate at the time of maintenance.

When the film formation for the band-like substrate one wind of bobbin is completed, one does not fully take out the band-like substrate from the apparatus. Since it is difficult to pass a new band-like substrate through the film forming chambers and the gas gates, due to narrowness of a gap of gas gates (normally from 1 mm to 10 mm), it is common practice that the leading end of a new band-like substrate is bonded to, by adhesion or welding means, and pulled by the trailing end of the previously film formed band-like substrate in order to pass throughout the apparatus.

That is, the band-like substrate always exists in the film forming chamber, thereby hampering the maintenance operation for the film forming chamber. Sometimes a desired component can not be taken out due to presence of the band-like substrate.

FIG. 3 is a typical view representing such a situation. In FIG. 3, 301 is a vacuum chamber, 302 is a gas gate, 303 is a band-like substrate, 304 is an upper lid, and 305 is a film forming chamber.

As will be clear from the figure, the parts constituting the film forming chamber, can not be easily taken out, because the band-like substrate 303 is an obstacle. Also, the band-like substrate 703 is difficult to clean on the bottom side. Namely, with a batch-type film forming apparatus, the maintenance operation can be performed after taking out the substrate, while with a roll-to-roll type, the maintenance was difficult, because the substrate remains in the form of a lengthwise continuous body.

Also, with the film forming apparatus and process making use of the above-described band-like substrate, problems such as discharge leakage, deformation of band-like substrate, difficulty in conveying the band-like substrate, rupture, or short-circuit of rf introducing portion, may occur as a result of repeated heating and cooling of the vacuum vessels and film forming chambers by operation and stop of the apparatus.

SUMMARY OF THE INVENTION

An object of the present invention is to resolve the aforementioned problems in carrying out the continuous film formation on a substrate, and to provide a film forming apparatus where unnecessary matter, such as powder or film material deposited on sites other than the substrate, can be removed in a short time, thus improving maintenance and limiting apparatus down-time.

It is another object of the invention to resolve the aforementioned problems in carrying out the continuous film formation on a substrate, and to provide a film forming apparatus which can raise the yield of forming functional deposited films in various electronic devices by avoiding discharge leakage, abnormal discharge (local discharge), deformation or rupture of band-like substrate, or the trouble in conveying the substrate.

To accomplish the above objects, as a first form of the present invention, there is provided a film forming apparatus for performing a continuous process on a substrate to form multiple films, comprising a plurality of vacuum chambers in communication to each other via a connection, at least one vacuum chamber internally having a treatment room for performing a predetermined treatment on the substrate, which can be attached on or detached from said vacuum chamber.

To accomplish the above another object, as a second form of the present invention, there is provided a film forming apparatus for performing a continuous process on a substrate to form multiple films, comprising a plurality of vacuum chambers in communication to each other via a connection, at least one vacuum chamber internally having a treatment room for performing a predetermined treatment on the substrate, and a mechanism for adjusting the position within said vacuum chamber of said treatment room in a horizontal plane.

DETAILED DESCRIPTION OF THE PREFERRED EMBODIMENT

Figure 1:
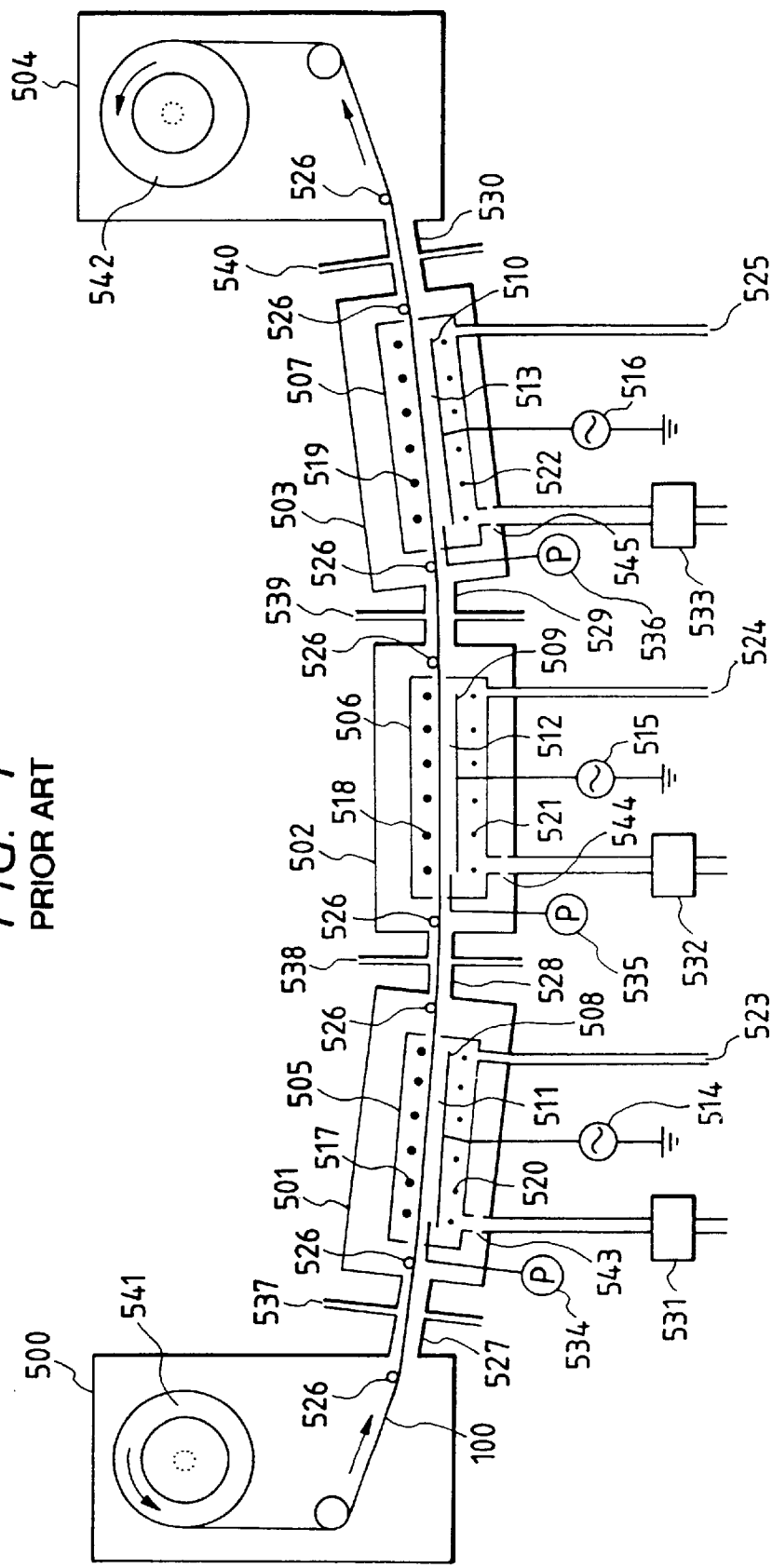
FIG. 1 is a view showing one example of a plasma CVD system of roll-to-roll type.

A first form of the present invention is an apparatus for performing the continuous film formation particularly on a substrate, having enhanced maintenance capability and less down-time, in which a film forming chamber can be pulled out of a vacuum chamber and detached therefrom. That is, a film forming apparatus for performing the continuous film formation on a substrate, comprising a plurality of vacuum chambers connected to each other via e.g. a gas gate, while having internally a treatment room such as a film forming chamber, a film forming space being formed by said substrate in contact with the opening side of the film forming chamber, wherein the film is continuously formed on the substrate while the substrate is being moved in a longitudinal direction of said plurality of vacuum chambers connected to each other, characterized in that said treatment room can be pulled out of said vacuum chamber, and detached from said vacuum chamber.

In the present invention, said treatment room, forming one face of vacuum chamber, can be pulled out of said vacuum chamber by removing a flange detachable from said vacuum chamber from said vacuum chamber.

In doing so, the flange supports detachably the treatment room by means of a support mechanism provided on the flange and extending in a direction into the vacuum chamber, wherein the treatment room is pulled out of the vacuum chamber by guiding the support mechanism via a guide mechanism.

Also, in cases where the treatment room is the film forming chamber, it is connected to a gas supply portion for supplying a film forming gas to the film forming chamber via a joint having an O-ring, wherein this gas supply portion is provided within the vacuum chamber and outside the film forming chamber in the state where the film forming chamber is placed within the vacuum chamber.

Further, with the present invention, the film forming chamber can be pulled out of the vacuum chamber by one-touch, in which a waveguide for introducing electric power provided on the side of the film forming chamber is connected via a connecting clamp to an applicator for applying electric power to the waveguide which is provided on the side of the flange for the vacuum chamber.

By using such apparatus of the present invention, after the end of the film forming process once to several times, the treatment room pulled out of the vacuum chamber can be replaced with a new treatment room which has been cleaned for the film formation.

The present invention is also effective not only for the cases of introducing microwaves into the film forming chamber as the treatment room, but also for introducing RF power for film formation.

A first embodiment of the first invention will be described in detail in the following.

The present invention can greatly enhance the maintenance capability and decrease down-time of the apparatus simply by replacing the film forming chamber, without taking extra time for cleaning, because the treatment room such as the film forming chamber can be pulled out of the vacuum chamber and removed therefrom, after the end of the film forming process once to several times, as above described.

In the following, the contents of the present invention will be more specifically described, based on the drawings.

Figure 4:
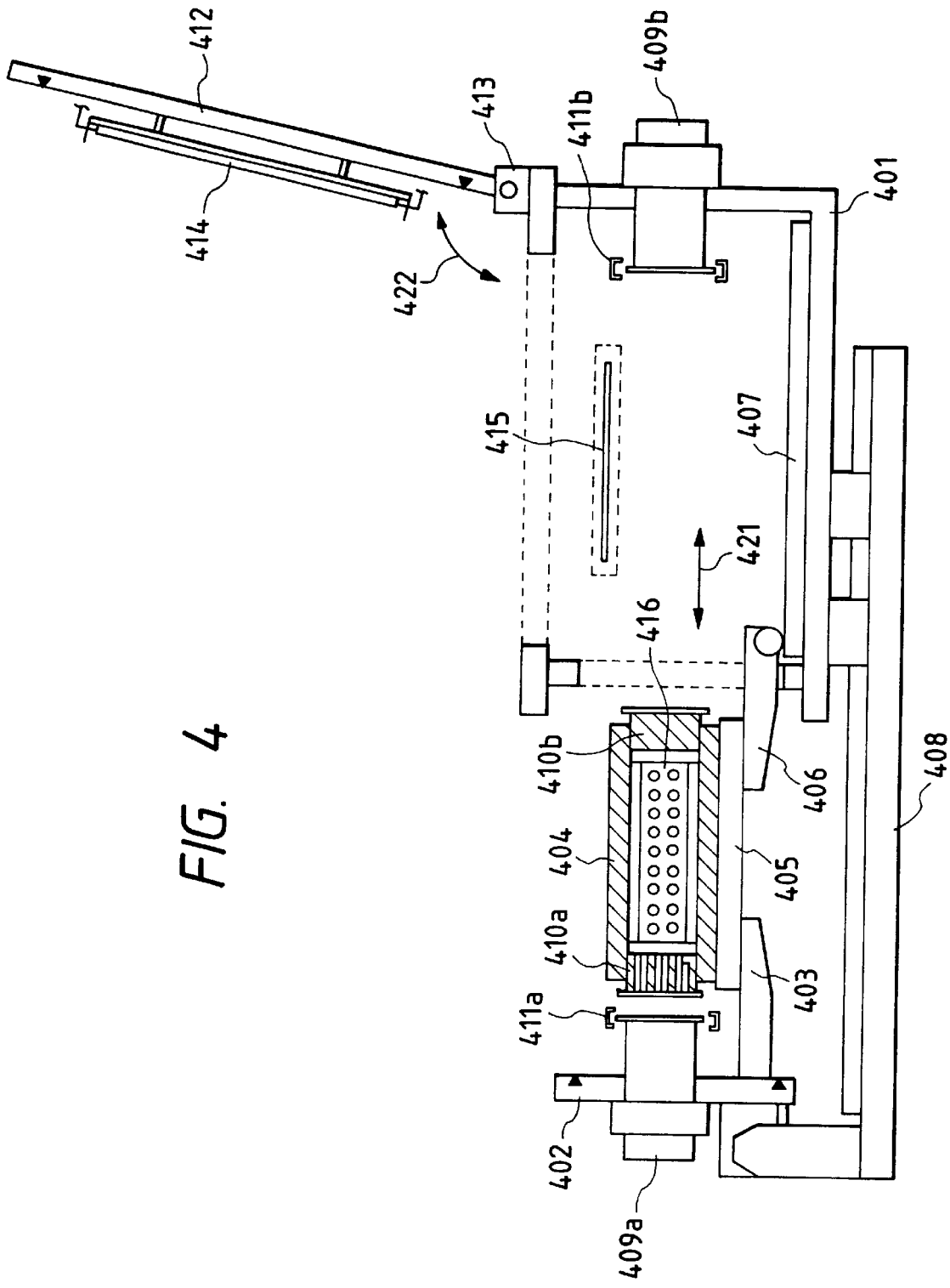
FIGS. 4 to 6 are views showing the structure of a vacuum chamber and a film forming chamber in one embodiment of a first film forming apparatus of the present invention.
Figure 5:
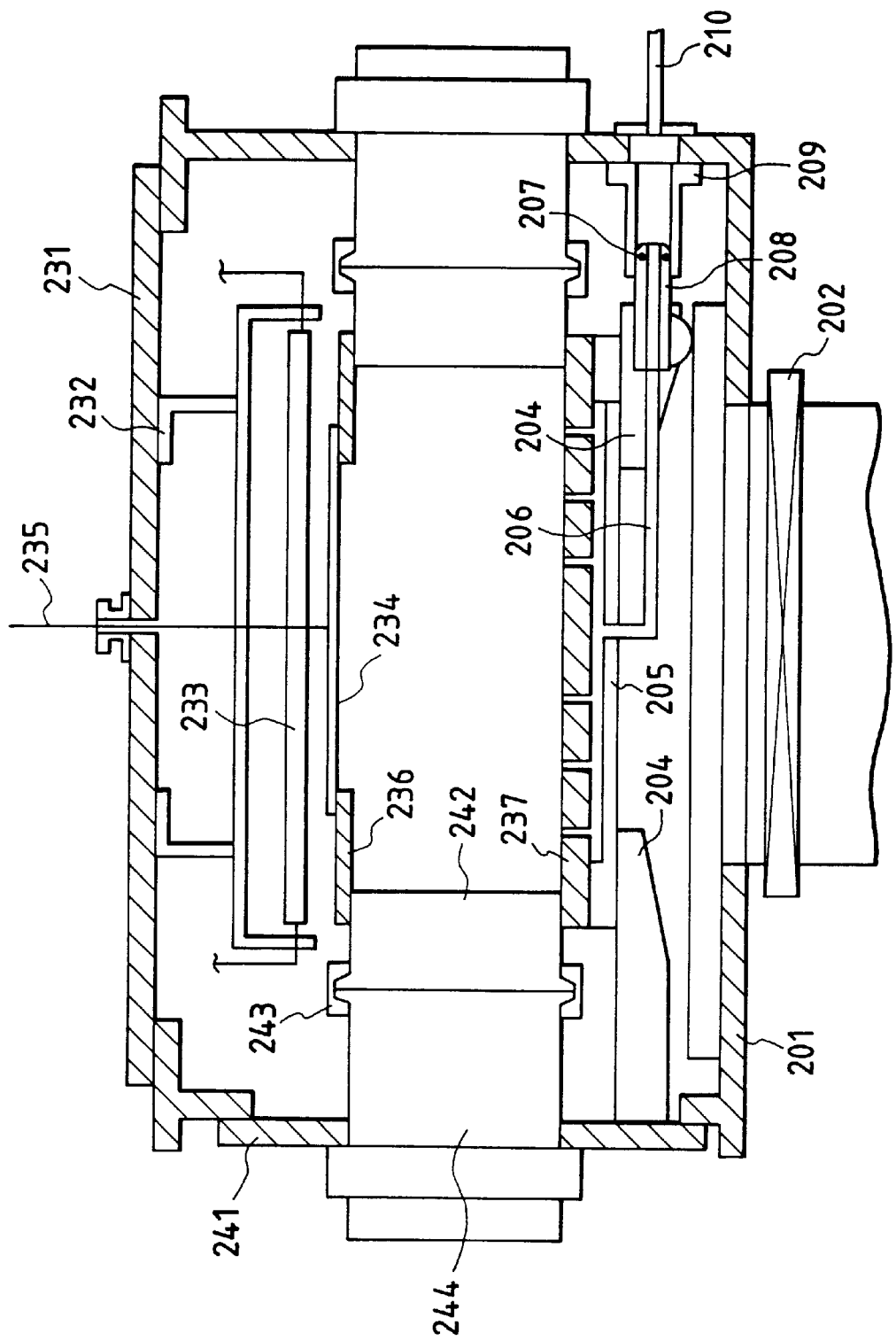
Figure 6:
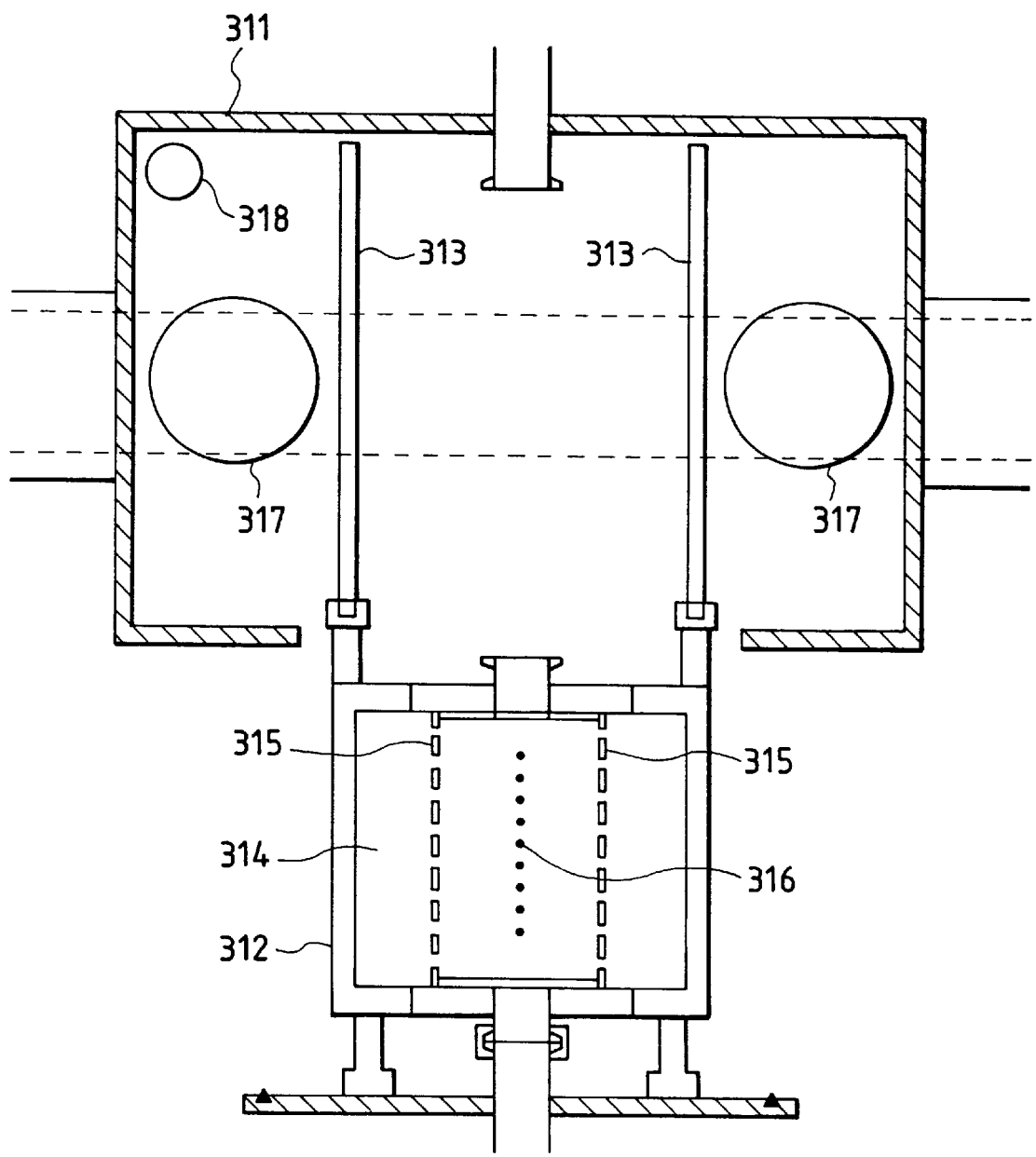

FIGS. 4 to 6 are typical views showing an example of a film forming chamber and a vacuum chamber as a treatment room in a film forming (CVD) process using microwaves, constituting a film forming apparatus of the present invention. FIG. 4 is a cross-sectional view of one chamber taken along a direction perpendicular to the longitudinal direction of the film forming apparatus, showing the state where the film forming chamber is pulled out of the vacuum chamber, together with the flange of vacuum chamber, at the time of maintenance.

In FIG. 4, 401 is a vacuum chamber for placing the inside at reduced pressure, one face thereof being made up by a detachable flange 402. In this figure, the flange has been separated and pulled out therefrom.

403 is a bracket secured to the flange and extending toward the inside of the vacuum chamber, for detachably placing a film forming chamber 404 thereon, and supporting a plate 405 internally having a gas introducing mechanism (not shown). Also, the plate 405 is also supported by a bracket 406. The bracket 406 internally has a roller to be movable on a rail 407 in the directions of the arrow 416. On the other hand, a flange 102 is connected to a conveyance guiding mechanism 408 outside the chamber, thereby allowing the film forming chamber to be smoothly pulled out, e.g., manually, from the inside of the vacuum chamber.

On the faces opposite the vacuum chamber, microwave applicator means (409a, 409b) for introducing microwaves into the vacuum chamber are inserted, respectively, and on the atmosphere side (outside) are connected to microwave waveguides, not shown, to supply microwave power from microwave generators, not shown. The vacuum chamber 401 and the film forming chamber 404 are connected via the microwave guiding paths (waveguides) 410a, 410b for introducing microwaves from applicators 409a, 409b into the film forming chamber. The wave guiding paths 410a, 410b and the applicators 409a, 409b are connected and secured together by clamps 111a, 111b, respectively.

The upper side of the vacuum chamber 101 is an upper lid 112, which can be opened and closed around a hinge 113 as a fulcrum in the direction of the arrow 422.

On an inner side (inside the chamber) of the upper lid 112, an infrared lamp heater 414 for heating the substrate is placed to heat the substrate 415 passing continuously through the vacuum chamber 401. Also, the film forming chamber 404, together with the waveguides 410a, 410b, is designed to be easily detachable therefrom, with a portion indicated by the slant line being as a piece.

The side walls of the film forming chamber 404 at both ends in a longitudinal direction of the apparatus serve as the exhaust passage of film forming gases introduced into the film forming chamber 404, and are formed of a porous plate (punching metal) 416 for enclosing microwaves within the film forming chamber.

The waveguides 410a, 410b are preferably made in the form of a so-called PF (plasma-free) window. For example, the PF window has a number of metal fins having a thickness of about 1 mm stacked at an interval of several millimeters, the microwaves can proceed through their voids without loss by matching with the microwaves in the oscillating direction thereof, while plasma will attenuate through the voids. Thereby, the abnormal heating of the applicator due to plasma can be prevented.

Note that the waveguide 410a of FIG. 4 schematically shows the behavior of a fin in the PF window.

Referring now to FIG. 5, the state where the film forming chamber as shown in FIG. 4 is inserted within the vacuum chamber will be described below. In FIG. 5, 201 is a vacuum chamber for evacuating the inside of the air, and 231 is an upper lid for making up the vacuum chamber, which has been closed to reduce the internal pressure in this figure.

One face of the vacuum chamber is formed by a detachable flange 241, which is tightly secured to the vacuum chamber 201 via an O-ring (not shown) to reduce the internal pressure in this figure.

On the bottom face of the vacuum chamber, a valve 202 and a vacuum pump such as a diffusion pump are connected to make it possible to reduce the pressure within the vacuum chamber. As previously described in FIG. 4, the members 236, 237 making up the film forming chamber are a series of guide mechanisms for pulling out the film forming chamber, having a plate 205 for laying thereon the members 236, 237 on a guide mechanism 204. Also, the plate 205 is connected with a film forming gas introducing pipe. At the other end of the gas introducing pipe 206 there is a joint 208 having an O-ring 207, which is inserted into a connection sleeve 209 secured to the vacuum chamber side. Also, film forming gases are introduced from a gas supply unit, not shown, through the gas introducing flange 210 into the connection sleeve.

The connection between joint 208 and sleeve 209 is sealed by the O-ring 207, so that the gas introduced from the gas supply device not shown into the gas introducing flange 210 can pass to the plate 205 without leakage.

The plate 205 has a cavity inside, such that the gas introduced through the pipe 206 into the cavity within the plate is discharged through a hole provided at the other end of the plate, through a gas discharge hole penetrating through a bottom plate of the film forming chamber into the film forming chamber.

On the other hand, the upper lid 231 is provided with an infrared lamp heater 233 via a bracket 232. When an electric power controlled by a signal from a temperature sensor 235 provided in contact with the substrate 234 for forming the deposited film thereon is applied to the lamp heater, the substrate 234 is heated up to a desired temperature. A member 230 constituting the film forming chamber is secured to the bottom plate 237 which serves as a bottom member for the chamber wall. The bottom plate 237 is placed on the plate 205, both plates being secured together by screw or clamp, as required. The microwave waveguide 242 is fixed to the applicator 244 by a clamp 243. A film forming space is formed by the film forming chamber composed of members 236, 237 and the substrate 234.

Referring now to FIG. 6, a maintenance process for the film forming apparatus as above described will be described below. FIG. 6 is an upper view showing the state where the film forming chamber has been pulled out, at maintenance time.

In FIG. 6, 311 is a vacuum chamber, 312 is a plate pulled out forwards by sliding it via a guide mechanism 313, on which the film forming chamber 314 is laid. On both sides of the film forming chamber 314 are provided punching plates, the film forming gas discharged through the gas discharge hole 316 passing through a punching metal 315 out the film forming chamber 317. Thereafter, the gas is exhausted out of the system through a vacuum pipe not shown connected to the gas exhaust port 317.

Note that 318 is an exhaust port for evacuation of the air to be used in beginning to pull vacuum from a state near the atmospheric pressure.

In the following, using the film forming apparatus of roll-to-roll type according to the present invention as above described, a film forming process and a maintenance process which are carried out in practice will be described below with reference to FIG. 4.

Referring to FIG. 4, the maintenance process will be first described below. After the end of a first film forming process, the system is sufficiently purged, and after cooling, the exhaust valve is closed to introduce the inert gas such as $N_2$ or Ar into the system to place the interior of the vacuum chamber at an atmospheric pressure. After the inside of the chamber has been made atmospheric pressure, jigs such as bolts for securing the flange 402 to the vacuum chamber 401 are removed.

Subsequently, the upper lid 412 is opened, and the clamp 411 for securing the microwave waveguide 410 to the applicator 409 is removed.

Thereafter, the flange 412 is pulled out, using the rail 417 and the guide mechanism 418, along with the parts of the film forming chamber 414, to take out the film forming chamber 404 from the vacuum chamber 401.

Then, the securing jigs such as screws for securing the film forming chamber 414 to the plate 415 are removed.

In this state, the film forming chamber 414 can be easily removed in the form of cassette, together with the microwave waveguide.

In place of the removed film forming chamber, a new film forming chamber which has been cleaned is placed on the plate 405.

The removed film forming chamber is to be cleaned and regenerated by the time when the newly installed film forming chamber is removed again.

Preferably, several film forming chambers are prepared for use in rotation.

If the new film forming chamber has been installed, the film forming chamber is moved into the vacuum chamber. Thereafter, the flange 402 is fixed to the vacuum chamber 401 by means of screw and a vacuum seal is provided.

Subsequently, the waveguide 410 and the applicator 409 are connected by the clamp 411, the lid 412 is closed, and a vacuum seal is provided.

Referring now to FIGS. 5 and 6, a preprocessing and a film forming process will be described below.

After the film forming chamber is inserted into the vacuum chamber, with vacuum seals provided at all sites (FIG. 5), the valve connected to an exhaust port 318 for roughing as shown in FIG. 6 is opened to reduce the pressure within the system.

If the vacuum chamber has been placed in a fully reduced pressure state, the roughing is stopped, and then the exhaust port 317 is opened.

Subsequently, the inert gas such as He or Ar is supplied from the gas supply means, not shown, into the gas introducing flange 210 in FIG. 5. The supplied gas passes through the pipe 206 and plate 205 as shown in FIG. 5 between the film forming chambers, and then through the punching board to the exhaust port for exhausting the gas. In this state, electric power is supplied from electric power supply means not shown to the lamp heater 233, to start heating the substrate 234.

Heating and burning are performed in this state, usually at least thirty minutes, or several hours or more, as necessary, until the temperature is sufficiently at equilibrium, and residual gas within the chamber is evacuated fully for practical use.

If the heating is ended, the film formation is subsequently performed. To perform the film formation, the supply of gas such as He or Ar used for heating is stopped.

Then, at least the film forming source gases such as $SiH_4$ and $GeH_4$ and diluent gases such as $H_2$, He and Ar to be added as necessary or doping gases such as $PH_3$, $BF_3$ and $B_2H_6$ are supplied from the gas supply unit, not shown, in adjusted desired flow amounts. Such film forming gases flow through the gas discharge hole into the film forming chambers (236, 237), while at the same time being exhausted through the punching metal, so that the pressure can be determined from the relation between the flow and the exhaust speed, but is preferably adjusted in a range from about 1 to 100 mtorr.

In this state, if microwave power is applied from the microwave generator, not shown, via the applicator 244, through the waveguide 242 into the film forming chambers (236, 237) and film forming space made up by the substrate 234, a microwave discharge plasma is excited within the film forming chambers (236, 237), to start formation of desired deposited films on the substrate 234.

If the deposited film having a desired film thickness is obtained, the supply of microwave power is stopped in order to cease the film formation.

Subsequently, the supply of electric power to the lamp heater is stopped to cool the system. Thereafter, the maintenance process is repeated over again.

Although the process was thus described, the present invention has a joint 208 having an O-ring 207 at one end of the pipe 206 for supplying the film forming gas from the vacuum chamber 201 into the film forming chamber composed of the members 236, 237 and the substrate 234, whereby there is no need of disassembling or assembling the pipes in pulling out the film forming chamber from the vacuum chamber, or conversely placing back the film forming chamber into the vacuum chamber, because of the provision of the joint inserted into the sleeve 209.

In pulling or pushing the film forming chamber, this joint is automatically disengaged or engaged, thus yielding extremely enhanced operability. The waveguide passage 242 is similarly constructed, or can be detached by one-touch by means of a clamp in this embodiment, although it was fixed to the applicator and the film forming chamber by means of a number of bolts and nuts, typically using ordinary waveguides, for which it took a lot of time, with poor maintenance capability.

Also, in a normal microwave film forming apparatus, after the individual parts secured within the vacuum chamber are taken out, cleaned and regenerated, they must be reassembled, thus requiring much maintenance time. In contrast, the present invention provides a double structure in which the detachable film forming chamber is provided within the vacuum chamber, as above described, and the connection between them can be freed by one touch, and then assembled. Thus, the maintenance operation to be effected quite rapidly.

Figure 7:
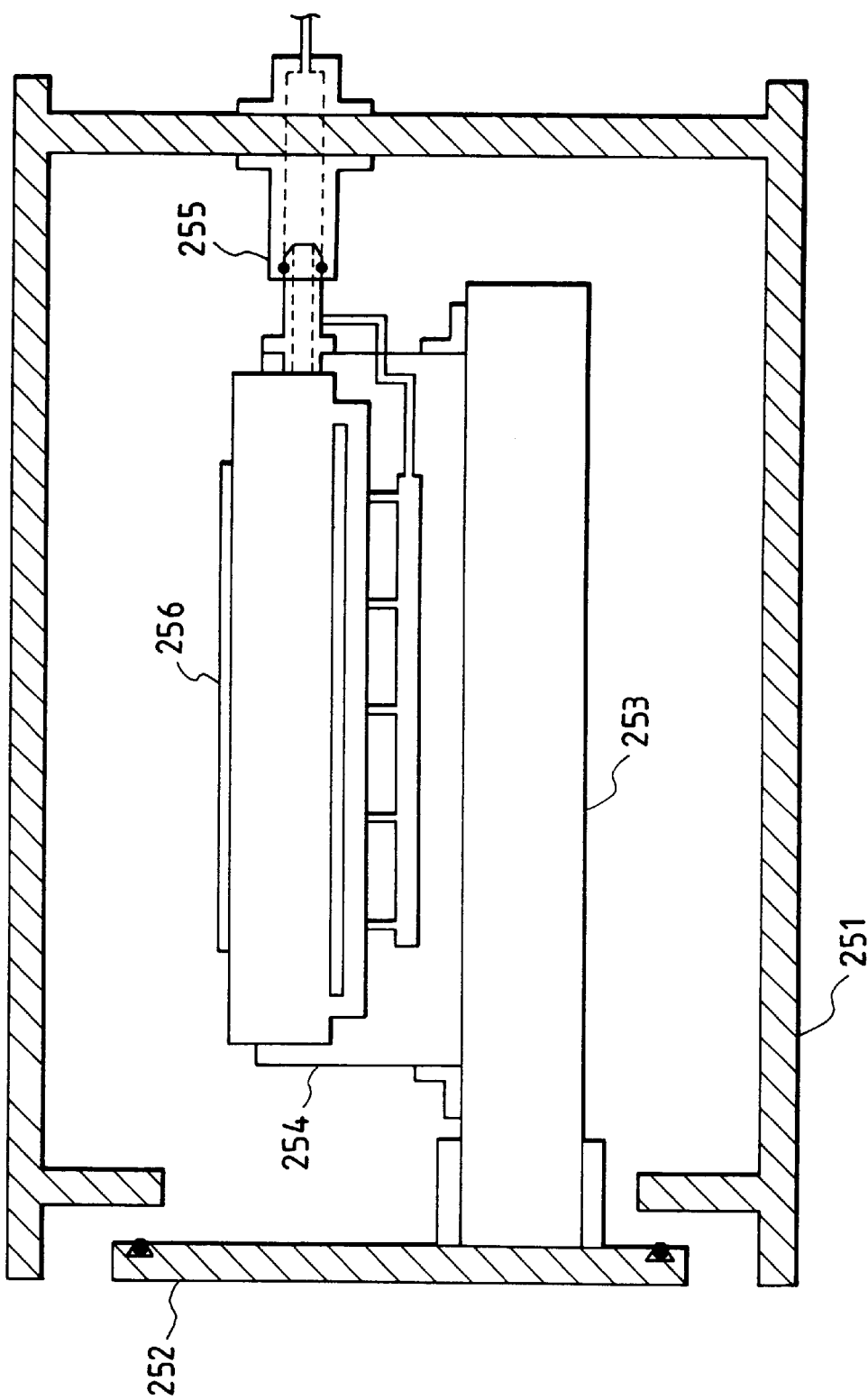
FIG. 7 is a view showing the structure of a vacuum chamber in another embodiment of the first film forming apparatus of the present invention.

In the following, a film forming apparatus using an RF system according to the present invention will be exemplified. FIG. 7 is a cross-sectional view of one chamber of the film forming apparatus for continuously forming the film on the substrate, taken along a direction perpendicular to the longitudinal direction of the film forming apparatus, typically showing the film forming chamber and the vacuum chamber making use of the RF.

In FIG. 7, 251 is a vacuum chamber, one face thereof being formed by a detachable flange 252. Provided inside the flange 252 is a stay 253, on which the film forming chamber 254 is placed detachably. Like the microwave system, the film forming gas introducing pipe is provided with a joint 255 having an O-ring for connection between the pipe on the side of the vacuum chamber and the pipe on the side of the film forming chamber 254. The film forming gas is introduced through this joint 255, and blown through the gas discharge hole into the film forming chamber 254.

The flange 252 has a guide mechanism (not shown) as in the case with the microwave system as previously described, and can be smoothly attached or detached. A practical film forming process is substantially the same as that of the microwave system previously described, except for the following several items, and is not further explained.

As is the case of the microwave system, a film forming space is formed by the film forming chamber 254 and the substrate 256. The different point from the microwave system is that discharge is excited between the cathode and the substrate by an electrode rather than applicator means, since the plasma exciting means is RF (with a radio frequency of nominally 13.56 MHz as broadly used), and exhaust means such as a mechanical booster pump is employed, since the pressure for forming the film is in a range from 0.1 to 10 torr.

Also in the film forming apparatus making use of the RF system, according to the present invention, the maintenance can be achieved only by allowing replacement of the film forming chamber (254), as is the case of the microwave system previously described, resulting in greatly enhanced availability factor of the apparatus.

An example in which a solar battery of a-SiGe single cell using an a-SiGe layer as an i-layer (photoelectric conversion layer) is fabricated, using a film forming apparatus of roll-to-roll type to which the first invention is applied, will be described below.

The film forming apparatus of roll-to-roll type which is applied to the manufacture of a solar cell is one of forming a plurality of layers including at least an n-type a-Si layer, an i-type a-SiGe layer and a p-type a-Si layer, making up the solar cell within the treatment rooms which are separate reaction vessels, by continuously delivering a band-like substrate for forming the a-SiGe film from a bobbin having the band-like substrate wound like a roll, this apparatus comprising a connecting member (commonly referred to as a "gas gate" or simply "gate") for allowing the substrate to move within a plurality of film forming spaces, while maintaining the reduced pressure state within each of the film forming spaces, and having a function of preventing mutual diffusion and mixture of source gases for e.g., n-type a-Si layer and p-type a-Si layer which are supplied into the film forming chambers.

Figure 8:
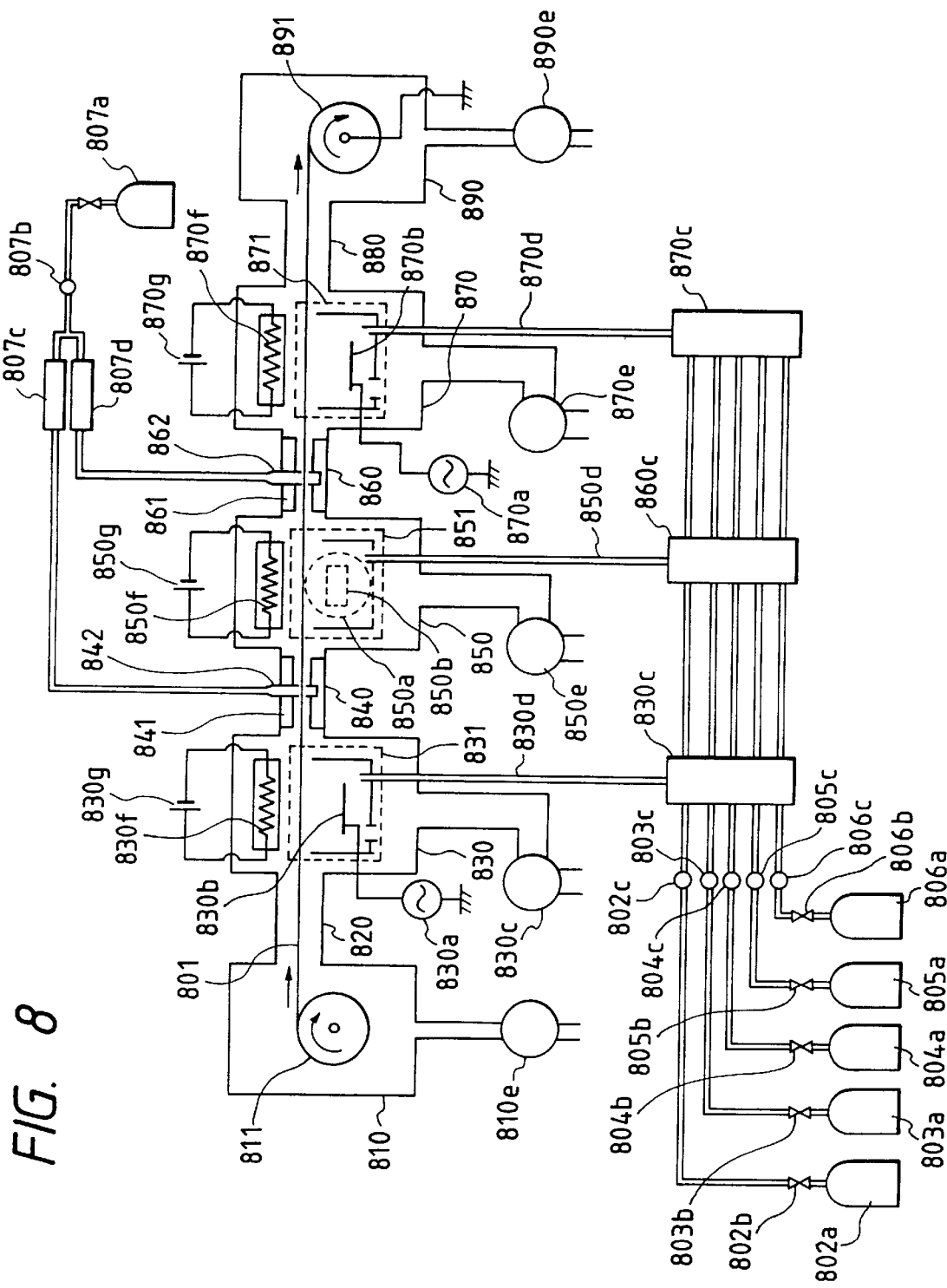
FIG. 8 is a view showing one example of a film forming apparatus of roll-to-roll type to which the present invention is applied.

FIG. 8 is a typical view showing one example of a film forming apparatus of roll-to-roll type for use in fabricating an a-SiGe solar cell of the present invention. Such apparatus makes an i-type a-SiGe layer having a great thickness of deposited film and for which high throughput is required, by means of $\mu$W (microwave), and makes n-type and p-type a-Si layers having a small thickness of deposited film and for which so high throughput is not required, by RF method.

In FIG. 8, 801 is a band-like substrate for depositing a-Si film thereon, which is usually a deformable conductive substrate in this example, for example, a flexible plate member such as a stainless or aluminum plate, or a member having coating of a conductive thin film on a non-conductive thin plate. The band-like substrate 801 is wound around the circular bobbin 511, and placed within a delivery room 810. The band-like substrate 801 delivered from the bobbin placed within the delivery room 810 is passed through a gas gate (hereinafter simply referred to as a "gate") 820, a vacuum chamber 830 having an n-type a-Si film forming chamber internally, a gate 840, a vacuum chamber 850 having an i-type a-Si film forming chamber internally, a gate 860, a vacuum chamber 870 having a p-type a-Si film forming chamber internally, and a gate 880, and then wound around a winding bobbin 891 placed within a winding chamber 890.

830a, 870a are RF generators, and 830b, 870b are cathode electrodes for exciting RF discharge to which electric power for depositing n-type a-Si layer and p-type a-Si layer is supplied, respectively.

850 is an applicator composed of a dielectric window for radiating microwave to the discharge space, to which electric power is applied from a microwave generator, not shown, through a rectangular waveguide 550b placed vertically in the dielectric window, to excite glow discharge within the i-type a-SiGe film forming chamber.

The vessels 802 to 806 are filled with gases which are sources for forming the deposited film, wherein 802 is filled with $SiH_4$ gas, 803 with $GeH_4$ gas, 804 with $H_2$ gas, 805 with $PH_3$ gas, and 806 with $B_2H_6$, for example.

Those gases are led through respective shut-off valves 802 to 806 and respective pressure reducers 802 to 806 into the gas mixers 830, 850, 870. The source gases which are mixed at desired flow amounts and mixing ratios by the gas mixers 830 to 870 are passed through the gas introducing lines 830, 850, 870 and blown into the film forming chambers. The gases introduced into the film forming chambers are exhausted by exhausters 810e, 830e, 850e, 870e, 890e comprised of an oil diffusion pump, a mechanical booster pump and a rotary pump, while the chamber pressures are being regulated to desired values, and led into an exhaust gas treating unit, not shown. Electric power is supplied from the power sources 830g, 850g, 870g for film forming chambers to the substrate heating infrared lamp heaters 830f, 850f, 870f.

841, 860 are parts for adjusting the gate opening in cross section to reduce the mutual diffusion of gases between film forming chambers by narrowing the gas flow passage. Further, to the gate, the gas such as e.g., $H_2$, or He which has no detrimental effect on the formation of film is supplied via gas inlet ports 842, 862 from a bomb 807 through respective pressure reducers 807, and flow regulators 807c, 807d, further preventing mutual diffusion of source gases between the film forming chambers.

The band-like substrate 801 delivered from the delivery chamber 810 is advanced through the film forming chambers in succession, to form an n-type a-Si film, an i-type a-SiGe film and a p-type a-Si film thereon, and finally entered into the winding chamber 890.

First, in the vacuum chamber 830 containing n-type a-Si film forming chamber internally, the band-like substrate is heated by the infrared lamp heater 830 up to a desired temperature. Also, the gases such as $SiH_4$, $H_2$, $PH_3$ which are sources for the n-type a-Si film are mixed at optimal flow rates by the gas mixer 830, and introduced into the film forming chamber. At the same time, RF power is applied from the RF generator 830a to the cathode 830b, to excite glow discharge within the film forming chamber to form n-type a-Si film on the surface of the band-like substrate 801.

Then, the band-like substrate 801 is advanced through the gate 840 to enter the vacuum chamber 850 having i-type a-SiGe film forming chamber internally. Within the vacuum chamber 850, the gases of $SiH_4$, $GeH_4$ and $H_2$ at optimal flow rates are supplied with optimal power to form i-type a-SiGe film on the n-type a-Si film, in the same manner as previously described. In the same manner, the band-like substrate 801 is passed through the gate 860 and the vacuum chamber 870 having p-type a-Si film forming chamber internally, and wound around the bobbin 891 within the winding chamber 890.

Herein, the vacuum chambers 830, 850, 890 are provided with detachable flanges 831, 851, 871 which are characteristic of the present invention. These flanges are provided with stay guide mechanisms for supporting the film forming chambers which are detachable in a direction perpendicular to the longitudinal direction of the vacuum chamber, as already described.

According to the procedure as previously described, the film formation and maintenance are performed. Then, before the deposited film is exfoliated from a site other than the band-like substrate of interest, the film forming operation is stopped, the system is purged, and the exhaust valve is closed to set the inside of the system at an atmospheric pressure.

Thereafter, the flanges 831, 851, 871 are pulled out, and the film forming chambers are replaced with new spare parts which have been cleaned, respectively. Subsequently, a vacuum is pulled on the system, and the film formation is started again.

EXPERIMENT 1

Figure 3:
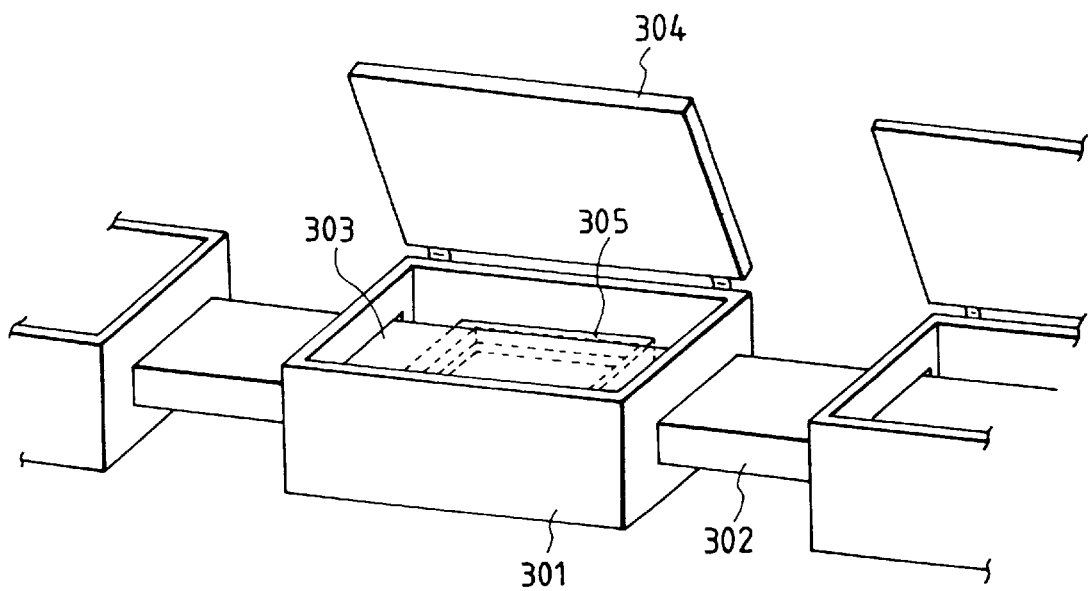
FIG. 3 is a view showing one example of a typical film forming apparatus of roll-to-roll type.

The film formation and maintenance was performed in a case of using the above-described film forming apparatus and in a case of using the apparatus having the vacuum chamber and the film forming chamber as shown in FIG. 3 under the same film forming conditions, and the maintenance time required was compared between both cases. For the apparatus as shown in FIG. 3, it took a total of three hours and fifty minutes including, Leak: 20 minutes Dismounting of parts: 30 minutes Regeneration of parts (blasting, etching): one hour Drying of parts: one hour Mounting of parts: 40 minutes Pulling vacuum: 20 minutes, while in the present invention (with the apparatus as shown in FIG. 8), it took a total of one hour including, Leak: 20 minutes Replacement of parts: 20 minutes Pulling parts: 20 minutes with a greatly enhanced availability factor of the apparatus.

An example of an apparatus for fabricating a solar battery of a triple cell structure composed of three p-i-ns, using the film forming apparatus of roll-to-roll type of the first invention, will be described below.

Figure 9:
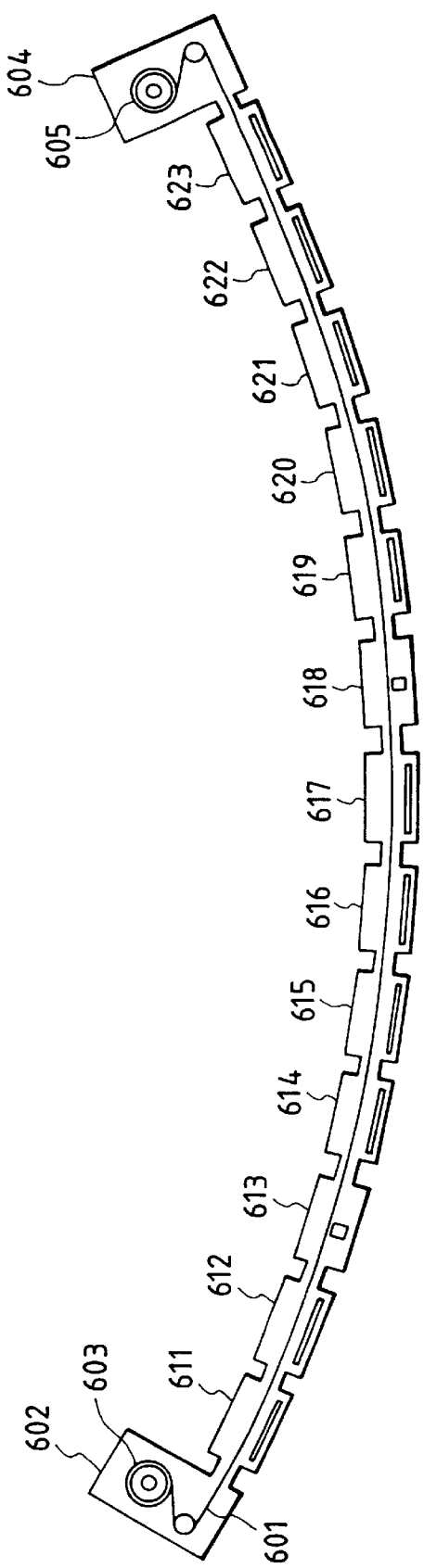
FIG. 9 is a view schematically showing another example of a film forming apparatus of roll-to-roll type to which the present invention is applied.

The configuration of solar battery comprises photoelectric conversion layers of a-SiGe on a bottom cell made by microwave method, a-SiGe on a middle cell made by microwave method, a-Si on a top cell made by RF method, or other layers made by RF method. FIG. 9 is a typical view showing an typical example of the film forming apparatus of the present invention for fabricating such solar battery.

In FIG. 9, 601 is a band-like substrate. The band-like substrate is SUS430 e.g. 350 mm wide and 0.15 mm thick, which has been subjected to washing and surface preparation at the previous step. The surface preparation specifically includes a coating of metal to enhance the light utilization efficiency with increased reflection, but is listed in detail in Table 1.

Such band-like substrate is let out from the delivery bobbin 603 placed on the delivery chamber 602 to the film forming chambers.

The substrate having passed through all the film forming chambers to form the films thereon is wound around the winding bobbin 605 placed within the winding chamber 604. 611 to 623 are vacuum chambers having film forming chambers internally, all chambers, including the delivery chamber 602 and the winding chamber 604, being connected via gas gates through which the band-like substrate can pass.

Also, with the increased number of chambers and the extended total length, one cannot ignore the drooping, due to gravity, of the band-like substrate, whereby all the chambers are arranged in a catenary form.

A flange of each vacuum chamber which is characteristic of the first invention, having a structure as shown in FIGS. 4 and 5, for example, can be removed, together with the film forming chamber, in a direction perpendicular to the longitudinal direction of the connected vacuum chambers.

The functions of a film forming chamber placed within each vacuum chamber are listed below.

611: RF film forming chamber for bottom cell n-layer film formation

612: RF film forming chamber for bottom cell n/i diffusion preventing layer film formation 613: Microwave film forming chamber for bottom cell i-layer film formation 614: RF film forming chamber for bottom cell i/p diffusion preventing layer film formation 615: RF film forming chamber for bottom cell p-layer film formation 616: RF film forming chamber for middle cell n-layer film formation 617: RF film forming chamber for middle cell n/i diffusion preventing layer film formation 618: Microwave film forming chamber for middle cell i-layer film formation 619: RF film forming chamber for middle cell i/p diffusion preventing layer film formation 620: RF film forming chamber for middle cell p-layer film formation 621: RF film forming chamber for top cell n-layer film formation 622: RF film forming chamber for top cell i-layer film formation 623: RF film forming chamber for top cell p-layer film formation

EXPERIMENT 2

A triple cell solar battery was fabricated in practice using a film forming apparatus as shown in FIG. 9. A specific procedure thereof is the same as that of the apparatus as shown in FIG. 8 and already applied in experiment 1. Also, the film forming conditions in detail are listed in Table 1 below. Note that the conveying speed of band-like substrate was 500 mm/min.

The band-like substrate corresponding to one bobbin was wound around a winding bobbin, the film formation is stopped at every time the exchange of bobbin is required (hereinafter referred to as "one film forming cycle"), to perform maintenance for all the chambers by purging, cooling and leaking.

The exchange of i-layer film forming chambers 613, 618 using microwave having high film forming speed and requiring deposit of substantial film thickness was done every film forming cycle, and the exchange of other film forming chambers was done every five film forming cycles.

In this way, a total of ten film forming cycles were performed. From the resulting solar batteries for ten film forming cycles, i.e., ten rolls, three samples 1 cm square per roll were cut out, to which a transparent electrode (ITO) and a collector electrode (Al) were vapor deposited, whereby the solar battery conversion efficiency was evaluated under illumination of AM1.

The result of evaluating the characteristics for 30 sheets of samples indicated that the conversion efficiency could fall within a range from 10.58 to 10.75%.

The maintenance operation only involves exchanging the film forming chamber after venting the vacuum chamber, and thus can be accomplished quite rapidly, resulting in greatly reduced down-time than ever before.

Note that a way of shortening the cleaning time of treatment room in the film forming apparatus has been disclosed in Japanese Laid-Open Patent Application No. 62-218570, for example.

According to this patent, a portion requiring cleaning takes the form of a cassette, and the portion requiring cleaning is removed at the time of maintenance, and replaced with a new cassette which has been prepared and cleaned, thereby resulting in substantially shortened cleaning time.

That is, a plurality of cassettes are prepared, and cleaned while not in use.

However, the above way of shortening the treatment room cleaning time was implemented for the batch-type deposited film manufacturing apparatus, but did not refer to the application to the system of continuously forming the film on the substrate such as a roll-to-roll processing system. In particular, the film forming method or apparatus cleaning only necessary vacuum chambers while the band-like substrate remains within the vacuum chamber is unique to the present invention.

Where the substrate is continuously input in a vacuum processing apparatus, for example, an asher, an etcher, and a CVD system, particularly when the roll-like band-like substrate is used, to replace the substrate or the parts of treatment room, it was necessary that all the chambers including the delivery chamber and the treatment room be vented to replace the substrate and the parts because the continuous substrate is delivered.

To return to its original state after the so-called maintenance process, the cleaning of treatment room, the vacuum up for removing the gas or water content adsorbed to the wall face of treatment room, the pretreatment, for example, a presputter for cleaning the surface of target oxidized if the sputtering system is used, or an operation of removing attachments on the surface by heating and evaporating the evaporating material which has been oxidized if the evaporation system is used, are required, significantly decreasing the availability of the treatment device or increasing the work involved.

In particular, in performing the treatment in vacuum at high temperatures, a sufficient amount of time was needed to decrease the temperature by turning off the switch of the heating device, in addition to the above operation, before venting. Further, after maintenance, more time was required for heating up to high temperatures to return to its original state, often resulting in markedly degraded availability of the apparatus.

Specifically considering the time required in such an operation, for example, in the CVD system, it normally takes about 30 minutes to 2 hours to cool the apparatus, about 10 minutes to one hour to vent the vacuum chamber, about one hour to three hours to clean the treatment room, about one hour to five hours to increase the degree of vacuum, and about one hour to five hours to elevate the temperature, depending on the conditions or the dimensions of the individual apparatus.

Accumulation of such time for every vacuum chamber remarkably degrades the availability of the apparatus. These affairs are the same as those of the sputtering or etching system.

In Japanese Laid-Open Patent Application No. 3-30419 and Japanese Laid-Open Patent Application No. 5-251361, it was disclosed that the delivery chamber and the winding chamber for the substrate, and further the vacuum chambers having predetermined treatment rooms are only selected and set to the atmosphere, while maintaining necessary treatment rooms at predetermined degree of vacuum, using a member for partitioning between adjacent vacuum chambers with the band-like substrate pinched therein.

Thereby, the substrate can be replaced, and the cleaning operation of treatment room set to the atmosphere can be also effected, while maintaining the pressure and temperature within the vacuum chamber other than those set to the atmosphere in desired state. However, the cleaning time of the treatment room is not fundamentally shortened.

Also, for shortening the cleaning time of the treatment room in the film forming apparatus, there is a method as disclosed in Japanese Laid-Open Patent Application No. 62-218570, previously described, but none of the methods or apparatuses were suggested which can be effectively applied to the system of continuously forming the film on the substrate.

Thus, a second film forming apparatus of the present invention is provided with a delivery mechanism, a treatment room, and a winding mechanism within each of a plurality of vacuum chambers connected, wherein the substrate is moved from said delivery chamber to the winding chamber through the vacuum chambers having the treatment rooms to continuously treat the substrate, wherein the treatment room is detachably constructed from the vacuum chamber, and gate valves are provided to yield a pressure difference between adjacent vacuum chambers in a state where the band-like substrate is passed therethrough, and closed at the time of maintenance, with only the vacuum chambers requiring maintenance set to atmospheric pressure, whereby the detachable treatment rooms are replaced with the spare rooms, or the bobbin for the delivery mechanism or winding mechanism is replaced with a new one.

In the above-mentioned film forming apparatus and method, in particular, the roll-to-roll processing system, the treatment of the substrate particularly in the form of a band within the treatment room can be effected by making use of a microwave CVD method, an RFCVD method, or the microwave CVD method and RFCVD method at the same time.

With the roll-to-roll processing method, the band-like substrate can be continuously moved.

And in the above-mentioned film forming apparatus, the gate valve is comprised of a movable portion having a valve for vacuum sealing the band-like substrate on a support, the valve and the support for the movable portion being formed of e.g. an O-ring, and the band-like substrate being made movable continuously.

In the apparatus for continuously forming the film with the gate valves applied as above-described, only the vacuum chambers requiring maintenance can be cleaned, while the band-like substrate is left behind within the vacuum chamber, resulting in greatly shortened cleaning time for maintenance, and yielding remarkably enhanced availability of the apparatus.

One form of the film forming apparatus and method to which the above-mentioned gate valve is applied in the present invention will be described below.

In the apparatus of such a construction, the vacuum chamber having a detachable treatment room may be, for example, a chamber for treating the substrate by microwave CVD, as shown in FIG. 6, or a chamber for treating the substrate by RFCVD method, as shown in FIG. 7.

Figure 10A:
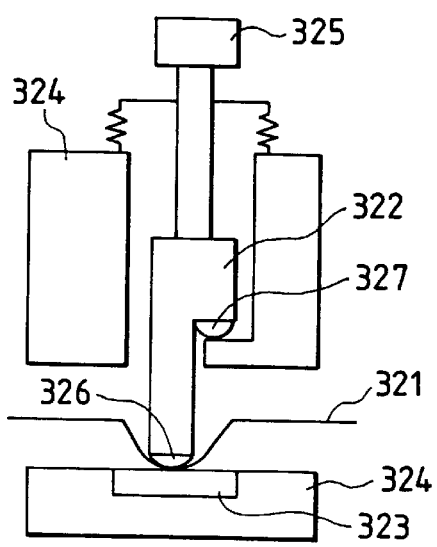
FIGS. 10A and 10B are views showing one example of a pinch valve for use with the film forming apparatus of the invention.
Figure 10B:
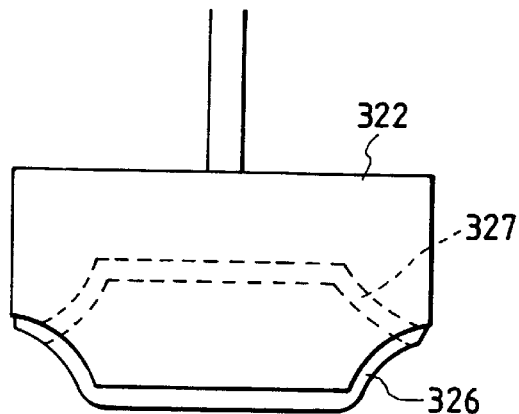

FIGS. 10A and 10B are schematic views showing a gate valve (hereinafter abbreviated as a "pinch valve") for providing a pressure difference between adjacent vacuum chambers for use with the present invention, in which FIG. 10A is a side view thereof, and (B) is a front view of a movable portion.

In the same figure, 324 is a housing, 322 is the movable portion, 323 is a support, 325 is a drive mechanism, and 321 is a substrate subjected to film formation. The movable portion 322 of the pinch valve has a valve section 326 for shutting off the gas and deposited unwanted matter and a valve section 327 for shutting off deposited unwanted matter which can pinch the substrate 321, and is driven by a pinch valve driver 325 to open or close the pinch valve to provide a pressure difference therebetween. The valve section for the movable portion 322 in contact with the substrate 321 and the support 323 are formed like an O-ring, the material thereof being Byton rubber for the vacuum seal, for example.

In the first film forming apparatus or method of the present invention, use of a pinch valve capable of independently leaking the easily detachable treatment room and each vacuum chamber as already described allows for maintenance by selectively venting only the treatment room having large attachment of the film made by e.g. CVD method. Accordingly, the vent time can be shortened.

Also at the time of maintenance to be performed, the vacuum chamber which was not vented can continue to maintain a baking state, resulting in shorter heating time after maintenance. Further, since the vented chamber is limited, the time for pulling vacuum again after maintenance can be shortened. Further, another merit is that since atmospheric leak is not performed for the chambers requiring no maintenance every time after treatment, the mixture of impurities such as water, oxygen or nitrogen which cause problems in vacuum treatment can be reduced.

An example of a processing apparatus relying on a method of fabricating an amorphous solar battery with source gas decomposition by microwave and RF in which a film forming apparatus having a pinch valve and a detachable treatment room according to the present invention is applied to the roll-to-roll film forming apparatus, will be schematically described below. The roll-to-roll film forming apparatus which is applicable to the manufacture of the solar battery in which a plurality of layers including at least an n-type a-Si layer, an i-type a-SiGe layer and a p-type a-Si layer which constitute the solar battery are formed within treatment rooms which are separate reaction vessels by continuously delivering the band-like substrate from the bobbin around which the substrate is wound like a roll, but the substrate is made movable through the treatment rooms and supplied thereto, while maintaining a reduced pressure state in each treatment space. For example, there is provided a connecting member (commonly referred to as a "gas gate" or simply a "gate") having a mechanism for preventing mutual diffusion or mixture of source gases for an n-type a-Si layer and a p-type a-Si layer.

Figure 11:
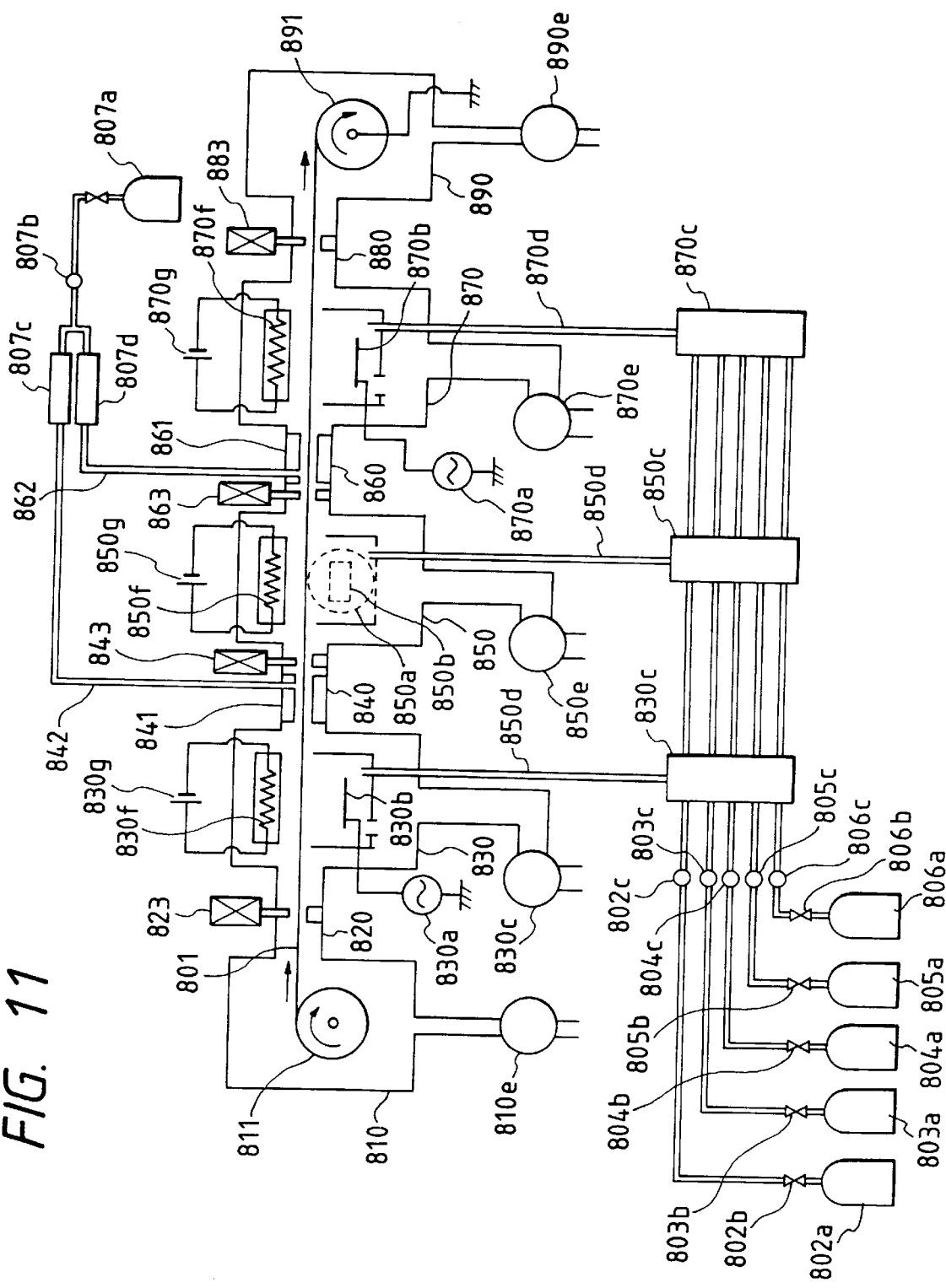
FIG. 11 is a view showing a further example of a film forming apparatus of roll-to-roll type to which the present invention is applied.

FIG. 11 is a typical view showing an example of a film forming apparatus for use in fabricating semiconductor devices such as an a-SiGe solar battery comprising the maintenance chamber and the pinch valve. With such apparatus, the i-type a-SiGe layer having a large thickness of deposited film, for which high throughput is required, is made by $\mu$W method (microwave), while the n-type and p-type a-Si layer having small thickness of deposited film, which does not require as high a throughput as the i-type a-SiGe layer, is made by the RF method.

The apparatus as shown in FIG. 11 has fundamentally the same constitution as the film forming apparatus as shown in FIG. 8 and previously described (in FIG. 11, like numerals are used to indicate the same parts as in FIG. 8), in which the band-like substrate 801 is wound around the circular bobbin 811, and provided within the chamber 810 having a delivery mechanism inside (hereinafter abbreviated as a "delivery chamber").

The band-like substrate 801 delivered from the bobbin placed in the delivery chamber is passed through the gas gate (hereinafter abbreviated as "gate") 820, the vacuum chamber 830 having internally n-type a-Si film forming chamber, the gate 440, the vacuum chamber 850 having internally i-type a-SiGe film forming chamber, the gate 800, the chamber 870 having internally p-type a-Si film forming chamber, and the gate 880, and wound around a winding bobbin 891 placed within the chamber having a winding mechanism (hereinafter abbreviated as a "winding chamber").

And these vacuum chambers 830, 850, 870 each have a film forming chamber as a treatment room provided inside thereof detachable in a direction perpendicular to the longitudinal direction (arrangement direction) of the vacuum chamber, as shown in FIGS. 4, 5 and 7.

The apparatus as shown in FIG. 11 is characterized in that the pinch valves 823, 843, 863, 883 are provided between chambers 810 and 830, chambers 830 and 850, chambers 850 and 870, and chambers 870 and 890, respectively. Such pinch valve is opened also during treatment such as film formation. If the treatment is ended, the valves on both sides of the chamber requiring the maintenance are closed to set only the desired chamber at atmospheric pressure.

In the apparatus as shown in FIG. 11, the film formation and maintenance can be made in accordance with the method for the apparatus as described in FIG. 8.

The band-like substrate 801 delivered from the delivery chamber 810 is advanced through the treatment rooms in succession, formed with an n-type a-Si film, an i-type a-SiGe film, and a p-type a-Si film on the surface thereof, and finally entered into the winding chamber 490.

First, the band-like substrate is heated up to a desired temperature by an infrared lamp heater within the chamber having the n-type a-Si film forming chamber. Also, the gases such as $SiH_4$, $H_2$, $PH_3$ which are sources for n-type a-Si film are mixed at respective optimal flow rates by a gas mixer 830, a mixed gas being introduced into a vacuum chamber 830. At the same time, RF power is applied to a cathode 830 by an RF generator 430a, exciting a glow discharge within the treatment space to form n-type a-Si film on the surface of the band-like substrate 801.

Then, the band-like substrate 801 is advanced through the gate 840 into the chamber 850 having the i-type a-SiGe film forming chamber. Within the chamber 850, the gases such as $SiH_4$, $GeH_4$, $H_2$ set at optical flow rates are supplied with optimal power, as previously described, to form desired i-type a-SiGe film on the n-type a-Si film.

Similarly, the band-like substrate 801 is passed through the gate 860 and the chamber having a p-type a-Si film forming chamber and wound around the bobbin 891 within the winding chamber 890.

With this apparatus, if the above treatment is ended, only the chambers requiring the maintenance are open to atmospheric pressure by closing the pinch valves 423, 443, 463, 483, and the film forming chambers as detachable treatment rooms are replaced with the spare rooms, after which the pressure is reduced for subsequent treatment.

Specifically, the chamber 850, the delivery chamber 810 and the winding chamber 896 are vented to atmospheric pressure by closing the pinch valves 823, 843, 863, 883. And while the treatment room 850 is replaced with a spare treatment room, the bobbin for the delivery chamber 810 is replaced with a new bobbin, and the bobbin after treatment of the winding chamber 890 is taken out to install a free bobbin.

As above-described, the roll-to-roll film forming apparatus and method thereof having the treatment room which can be easily attached or detached, and the pinch valve, is able to have drastically enhanced availability of the apparatus, and perform superior treatment continuously.

EXPERIMENT 3

A method of fabricating a solar battery of single cell structure having a single photoelectric conversion layer, using a film forming apparatus having a detachable treatment room from the vacuum chamber and the pinch valve, will be described below.

The constitution of solar battery uses a photovoltaic conversion layer of a-SiGe made by microwave, and other layers made by RF.

A band-like substrate 801 as shown in FIG. 11 is made of SUS430BA 350 mm wide, 0.15 mm thick, and 350 m long, and has already been subjected to washing and a surface preparation in the preprocess. The surface preparation specifically includes a metallic coating for enhancing the light utilization efficiency with increased reflection.

The film forming conditions are listed in detail in Table 2.

The band-like substrate 801 is passed from the delivery bobbin 811 placed in the delivery chamber 810 through the gate 820, n-type a-Si film forming chamber 830, gate 840, i-type a-SiGe film forming chamber 850, gate 860, p-type a-Si film forming chamber 870, gate 880 around a winding bobbin 891 placed within the winding chamber 890, under tension adjustment to prevent the band-like substrate 801 from slacking.

Then, the delivery chamber 810, the winding chamber 890, the film forming chambers 830, 850, 870 were exhausted by exhausters 810e, 830e, 850e, 870e, 890e each comprised of an oil diffusion pump, a mechanical booster pump and a rotary pump, until the pressure within each chamber reached 1 Torr.

Thereafter, each of the infrared lamp heaters 830f, 850f, 870f was lit up, and the surface temperature of the band-like substrate 801 was made 800° C. under temperature control, followed by heating and degassing.

When the heating and degassing was sufficiently performed, the deposited film was continuously formed under the conditions as listed in Table 2.

Then, the moving speed of the band-like substrate 801 was 500 mm/min. Each treatment chamber was purged and maintenance was conducted for the next process, every time the band-like substrate 801 having a length of 350 m is ended and bobbin exchange is required (hereinafter referred to as "one process cycle").

In the maintenance, since the replacement of a treatment room for a-SiGe made by microwave having a high depositing rate and requiring a large thickness of the film, a delivery bobbin 811, and a winding bobbin 891 around which the band-like substrate 801 having the deposited film formed thereon is wound is conducted at every process cycle, the a-SiGe treatment room 850, the delivery chamber 810 and the winding chamber 890 are returned to atmospheric pressure by closing the pinch valves 823, 843, 863, 883.

However, since other treatment rooms are maintained at every ten cycles, vacuum is retained while the heating infrared lamp heaters 830, 870 are lit up.

For the a-SiGe treatment room, the cassette having deposited film attached thereon is taken out, and replaced with a new cassette which has been prepared and cleaned, and the delivery bobbin is taken out with the band-like substrate 801 cut away about 1 mm behind, and replaced with a new bobbin around which a new band-like substrate is wound.

Figure 12:
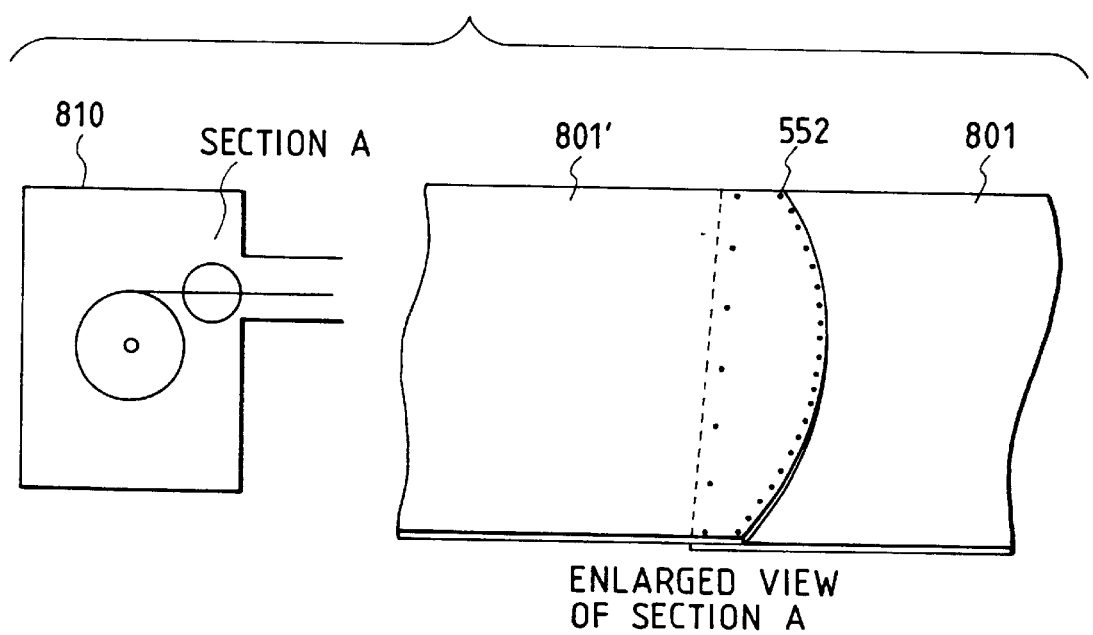
FIG. 12 is a view showing the junction structure of a band-like substrate.

As shown in FIG. 12, the new band-like substrate 801 is rounded at the end, and welded with the existing band-like substrate 801 by spot welding (552). The bobbin 891 around which the band-like substrate having deposited film formed is wound is taken out with the band-like substrate cut away, two or three rounds left behind, and replaced with a new winding bobbin, around which the band-like substrate two or three rounds left behind is then wound.

If the above maintenance is ended, vacuum is pulled by the exhausters 810e, 850e, 890e, and at the pressure equivalent to that of the treatment room retained in vacuum, the pinch valves 823, 843, 863, 883 are opened to restart the process.

The results of the availability factor of the apparatus for (a) roll-to-roll treatment with the apparatus as shown in FIG. 11 and (b) treatment with the apparatus not using the pinch valve are listed in Table 3. The availability factor is expressed as treatment time/(treatment time+rest time)×100%.

In (a), since the exchange of treatment room can be fulfilled in the form of cassette, the time for cleaning the treatment room and passing the band-like substrate through the apparatus, or particularly, the time for increasing vacuum by heating, because vacuum can be held by the pinch valve, where no maintenance is required, can be significantly shortened, resulting in enhanced availability of apparatus up to 81%.

Also, the characteristics of deposited film formed in this experiment were examined. Then samples obtained in (a) with an area of 5 cm square were cut out for every 30 m, and deposited with a transparent electrode (ITO) and a collector electrode (Al), whereby the conversion efficiency of solar battery was evaluated. The evaluation result of characteristic for ten samples indicated that the conversion efficiency could fall within a range from 7.81 to 8.03%, favorably compared with a conventional conversion efficiency of 7.95% for the sample similarly obtained in (b).

A method of fabricating a solar battery of triple structure having three p-i-n junctions, using a film forming apparatus to which a film forming apparatus having the pinch valve and the treatment room detachable from the vacuum chamber according to the present invention is applied, will be described below.

The constitution of solar battery uses a-SiGe made by microwave on the bottom cell and the middle cell, and photovoltaic conversion layer of a-Si made by RF on the top cell, and all other layers made by RF.

Figure 13:
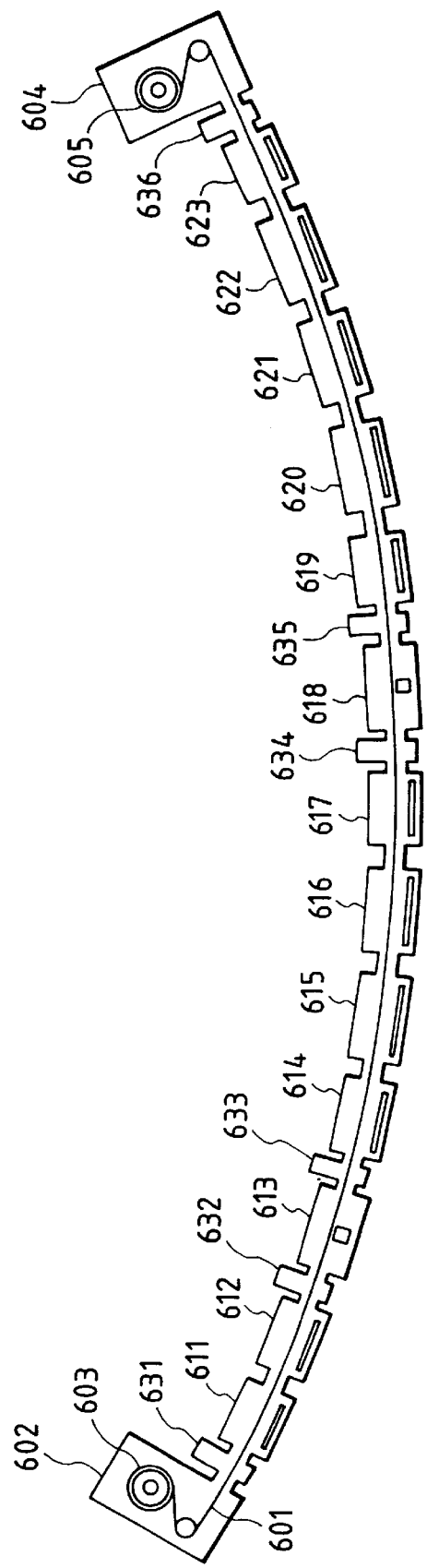
FIG. 13 is a view schematically showing a further example of a film forming apparatus of roll-to-roll type to which the present invention is applied.

FIG. 13 is a schematic view showing a typical example of an apparatus for fabricating such a solar cell.

A basic constitution of the apparatus as shown in this figure is the same as that of the apparatus as shown in FIG. 9 and previously described (in FIG. 13, like numerals are used to indicate the same parts as in FIG. 9).

Note that the vacuum chambers 611 to 623, as well as the delivery chamber 602, and winding chamber 604 are connected via the gas gates, as shown in the figure. The gates at both ends of i-type a-SiGe treatment room made by microwave, and in the delivery chamber and the winding chamber are provided with pinch valves 631, 632, 633, 634, 635, 636.

Also, with increased number of chambers and extended total length of apparatus, the drooping due to gravity of the band-like substrate 601 is significant and therefore all the chambers are arranged like a catenary.

EXPERIMENT 4

A solar battery having triple structure was fabricated, using an apparatus as shown in FIG. 13, according to a method as shown in FIG. 11 and under the conditions as listed in Table 1 and previously described.

A band-like substrate 601 is passed from a delivery bobbin 603 placed within a delivery chamber 602 through a chamber 611 having an n-type a-Si treatment room, an n/i diffusion preventing treatment room 612, a chamber 613 having an i-type a-SiGe treatment room, a chamber 614 having an i/p diffusion preventing treatment room, a chamber 615 having a p-type a-Si treatment room, for the bottom cell; a chamber 616 having an n-type a-Si treatment room, a chamber 617 having an n/i diffusion preventing treatment room 612, a chamber 618 having an i-type a-SiGe treatment room, a chamber 619 having an i/p diffusion preventing treatment room, a chamber 620 having a p-type a-Si treatment room, for the middle cell; and a chamber 621 having an n-type a-Si treatment room, a chamber 622 having an i-type treatment room, and a chamber 623 having a p-type a-Si treatment room, to a winding bobbin 605 placed within a winding chamber 604, under tension adjustment to prevent the band-like substrate from slacking. Subsequently, film formation was conducted, according to the method as described in experiment 4, and under the conditions as listed in Table 1.

The maintenance for the chamber having a-SiGe treatment room, the delivery chamber, and the winding chamber was conducted every process cycle, while that for other treatment rooms was conducted every ten process cycles, as in experiment 3.

The results of comparing the availability factors for (c) roll-to-roll treatment with the apparatus as shown in FIG. 13 and (d) treatment with the apparatus not using the pinch valve for making the triple cell are listed in Table 3.

In (c), the number of treatment rooms to be cleaned decreases, the cleaning time, particularly the time for vacuum up can be greatly shortened, resulting in greatly enhanced availability of the apparatus up to 76%.

Also, the characteristics of deposited films formed in this experiment were examined. Ten samples with an area of 5 cm square were cut out for every 30 m, and deposited with a transparent electrode (ITO) and a collector electrode (Al), whereby the conversion efficiency of solar battery for triple cell was evaluated. The evaluation of characteristics for ten samples indicated that the conversion efficiency could fall within a range from 10.58 to 10.75%, favorably compared with a conventional conversion efficiency of 10.71% for the sample similarly obtained in (b).

In the apparatus for continuously forming the film on the substrate of the structure, as shown in FIG. 8, for example, as a result that heating and cooling of the vacuum vessel and the film forming chamber is repeated by operation and stop of the apparatus, the problems such as discharge leakage, deformation of band-like substrate, difficulty in conveying the band-like substrate, rupture, and short-circuit of rf introducing portion arise.

The causes for the problems such as discharge leakage, deformation of the band-like substrate, difficulty in conveying the band-like substrate, rupture, and short-circuit of rf introducing portion will be described below in due order.

Figure 14:
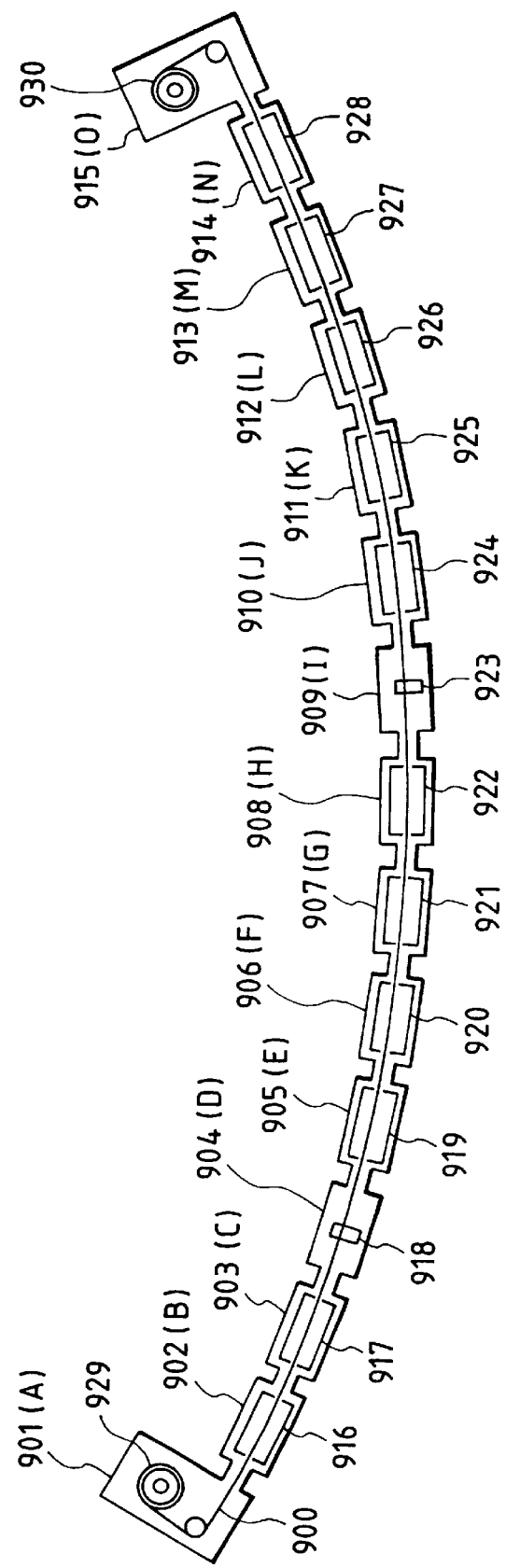
FIG. 14 is a view showing the positional relation between vacuum chambers, treatment rooms and a substrate in the film forming apparatus of roll-to-roll type.

First, when using an apparatus of roll-to-roll type as shown in FIG. 14, the possibility of discharge leakage will be described below with reference to FIGS. 15 and 16.

Figure 15:
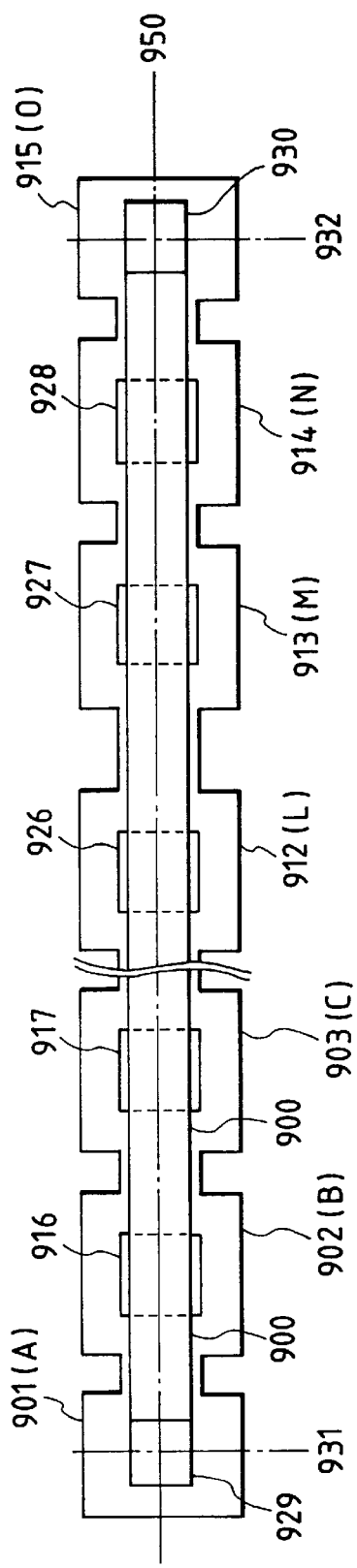
FIG. 15 is a view of the apparatus as shown in FIG. 14, as viewed from above.

FIG. 15 is an upper view of the apparatus as shown in FIG. 14, wherein 950 is a common center line of vessels (chambers) 901 to 915 arranged in a sequence.

The apparatus as shown in FIG. 14 has the same fundamental structure as that shown in FIG. 9, wherein there are provided in succession a plurality of vacuum chambers 902 to 914 between the chamber 901 on the delivery side and the chamber on the winding side, through which the band-like substrate 900 is conveyed. Also, each chamber 902 to 914 has a treatment room 916 to 928 which function as a film forming room for subjecting the substrate to film formation. Each treatment room 916 to 928 forms a film forming space relative to the band-like substrate 900.

931, 932 are a delivery axis and a winding axis, respectively, which are orthogonal to the center line 300. Also, the center line 950 is substantially coincident with that of the band-like substrate 900. In the apparatus of FIG. 14, the center line of all the vacuum vessels is substantially a straight line at the early stage of installation, as shown in FIG. 15.

It has been found that thereafter, if the apparatus of FIG. 14 is run, or stopped for the maintenance, the center line 950 might be displaced like an S-character, due to heat history of heating and cooling, depending on the conditions.

As will be described later, an example of the result of observing the displacement amount of the center line 950 is graphically represented in FIG. 16. In FIG. 16, the transversal axis is in a direction of conveying the band-like substrate 900, with the delivery axis 931 inside a vacuum vessel (chamber) 901 as an origin, and the conveying direction of the band-like substrate 900 or the direction toward the winding axis 932 being defined positive. On the other hand, the longitudinal axis is defined positive in an upper direction from the paper face of FIG. 15, and negative in a lower direction thereof, to represent in which direction the vacuum vessel 902, 914 is relatively displaced with reference to the band-like substrate 900.

Figure 16:
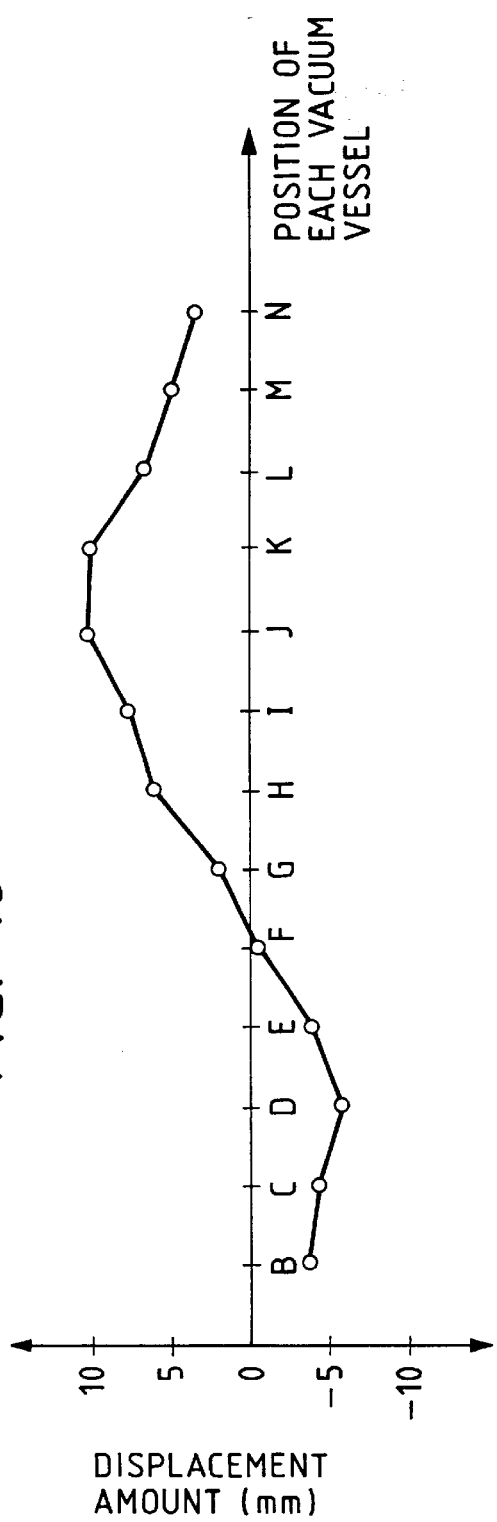
FIG. 16 is a chart showing the displacement amount of the vacuum chamber in the apparatus for continuously forming the film on the band-like substrate.

In FIG. 16, for example, a vacuum vessel 902 (B) is relatively slightly displaced in the lower direction in the drawing of FIG. 15 to the band-like substrate, and a vacuum vessel 914 (N) is slightly displaced in the upper direction.

The vacuum vessels 901, 915 contain a conveying mechanism, but because of a weight of about 6 tons, they can not be easily moved.

Figure 2:
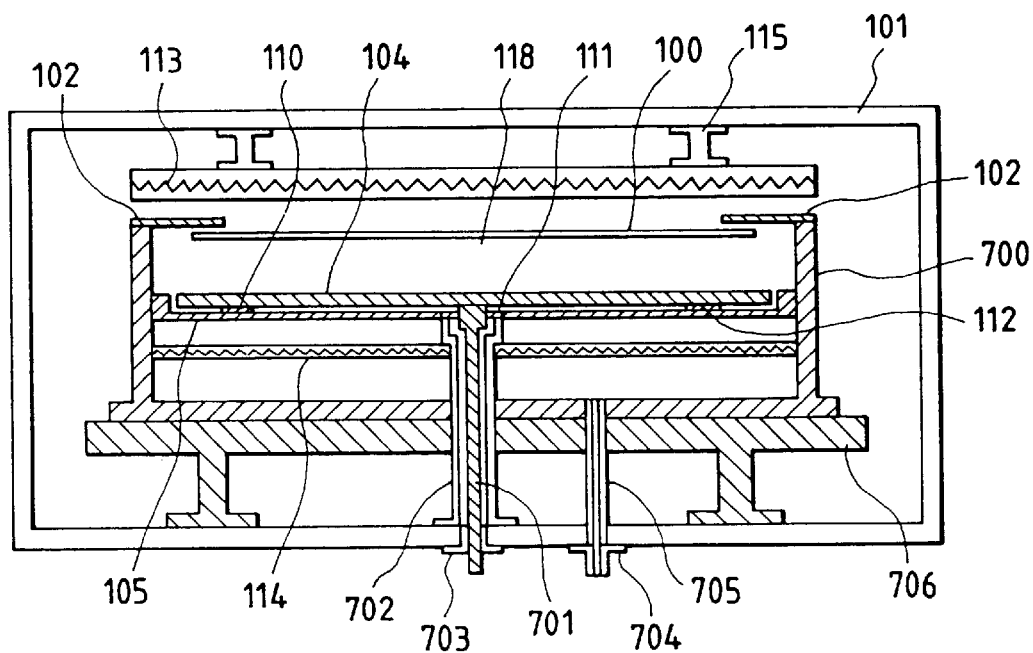
FIG. 2 is a view showing one example of the internal structure of a vacuum vessel for use with the apparatus as shown in FIG. 1.

By contrast, the vacuum vessels 902 to 914 as light as about a quarter the weight are prone to displacement, and the film forming chambers 916 to 928 contained and fastened within them are displaced by the same amount in the same direction. Owing to this displacement, the center line of the film forming chambers (treatment rooms) and the center line of the band-like substrate 900 are mismatched, resulting in a problem that a gap occurs between the band-like substrate 900 for forming the film forming chambers and the upper plate of treatment rooms 916 to 928 (e.g., a ceiling plate 102 for the chamber as shown in FIG. 2), causing discharge leakage.

Then, deformation or rupture of the band-like substrate, or difficulty in conveying the band-like substrate will be described below.

The discharge leakage was a problem caused by the arrangement relation between the band-like substrate 900 and the ceiling plate of each chamber, but if this displacement was further increased, a phenomenon was observed that the end portion of the band-like substrate mechanically abuts against the inner wall of the vacuum chamber or treatment room with the vacuum chamber.

With a slight contact force, the band-like substrate 900 may be only slightly deformed. With a greater contact force, however, a deformed portion of the band-like substrate 900 may be captured within the apparatus, making the conveyance impossible. In this state, if the tension is further increased, a problem arises that the band-like substrate will ultimately break away.

In the following, for the problems of short-circuit and local discharge in the RF power introducing portion, the situation that the film forming chambers are heated when the apparatus is activated, will be described, as an example, with the case of using that vacuum chamber as shown in FIG. 2. The film forming chamber 103 is heated by a substrate heater 113, a gas heater 114 and a plasma produced in a glow discharge space 118.

As a result, insulators 111, 112 for supporting a feeder board 701 and a discharge electrode 104 are broken away, causing the feeder board 701 and a shield 702 to be contacted and short-circuited. Consequently, the discharge can not be maintained and stabilized, resulting in the problem that the quality of deposited film on the band-like substrate 100 is dispersed and the yield is lowered. On the other hand, if the feeder board 701 and the shield 702 are separated apart to avoid short-circuit by thermal deformation, another problem arises.

That problem is producing a local discharge between the feeder board 701 and the shield 702, without exciting discharge in a desired glow discharge space (film forming space) 118.

Since the electric field density between the feeder board 701 and the shield 702 is greater than that of the glow discharge space 118, the local discharge is easily produced, depending on the condition. The condition is well known as a Paschen's law, to which no description is given herein.

In order to excite discharge only in the glow discharge space without producing the local discharge between the feeder board 701 and the shield 702, the dimensions of the feeder board 701 and the spacing between the feeder board 701 and the shield 702 may be experimentally determined.

As above-described, some measures for avoiding the short-circuit of the feeder board 701 are necessary.

A second form of the present invention is that when the arrangement of vacuum vessels is displaced within a horizontal plane due to the reason of repeated heating and cooling of the film forming chambers, the positional adjustment can be made by moving the film forming chamber within the horizontal plane to eliminate the relative misregistration between the film forming chamber and the band-like substrate, thereby preventing leakage of plasma discharge, and avoiding generation of abnormal (local) discharge, and avoiding the trouble such as deformation of the band-like substrate, difficulty in conveying the band-like substrate, or rupture.

This will be more specifically described below with reference to the drawings.

As previously described in connection with FIG. 15, with the film forming apparatus of roll-to-roll type, there is a phenomenon that as a result that the vacuum vessels 901 to 915 and the film forming chambers 916 to 928 heated and cooled by repeating the heating and cooling of the apparatus, the arrangement of vacuum vessels 901 to 915 is displaced and moved in the horizontal plane.

The arrangement of the vacuum vessels 901 to 915 is displaced to cause the film forming chambers 916 to 928 to be relatively misaligned with the band-like substrate 900, resulting in the problem of deforming the band-like substrate 900, making the conveyance difficult, or leaking plasma discharge, as previously described.

To resolve this, the film forming chambers 916 to 928 are moved in the horizontal plane for positional adjustment so that the band-like substrate 900 may pass through the proper positions of the film forming chambers 916 to 928.

However, in a vessel as shown in FIG. 2, for example, since the RF power and the source gases are introduced from the bottom face of a vacuum vessel 101 into a film forming chamber 700, and an inlet tube between the vacuum vessel 101 and the film forming chamber 700 is fixed such that the RF power and the source gases may not leak, the film forming chamber 700 can not be moved relative to the vacuum vessel 101 in the horizontal plane.

In the second form of the present invention, since the RF power and the source gases are introduced into the film forming chambers through the wall faces of vacuum vessels within a vertical plane, and perpendicular to the conveying direction, the film forming chambers of the present invention can be moved in the horizontal plane, allowing for the positional adjustment such that the center of the band-like substrate may pass through the central position of the film forming chamber.

Within one prismatic vacuum vessel, there are two wall faces within the vertical plane and perpendicular to the conveying direction, but the RF power and the source gases may be introduced from the same face among two faces, or another face.

Also, since the junction for a portion for introducing the RF power and the source gases which lies outside the film forming chambers and inside the vacuum vessels is elastic, the film forming chambers of the present invention can be moved in the horizontal plane, such that only the film forming chambers can be adjusted in position without moving the vacuum vessels.

First, referring to FIG. 17, one form of positional adjustment for the film forming chambers 306 in a second film forming apparatus of the present invention will be described below.

Figure 17:
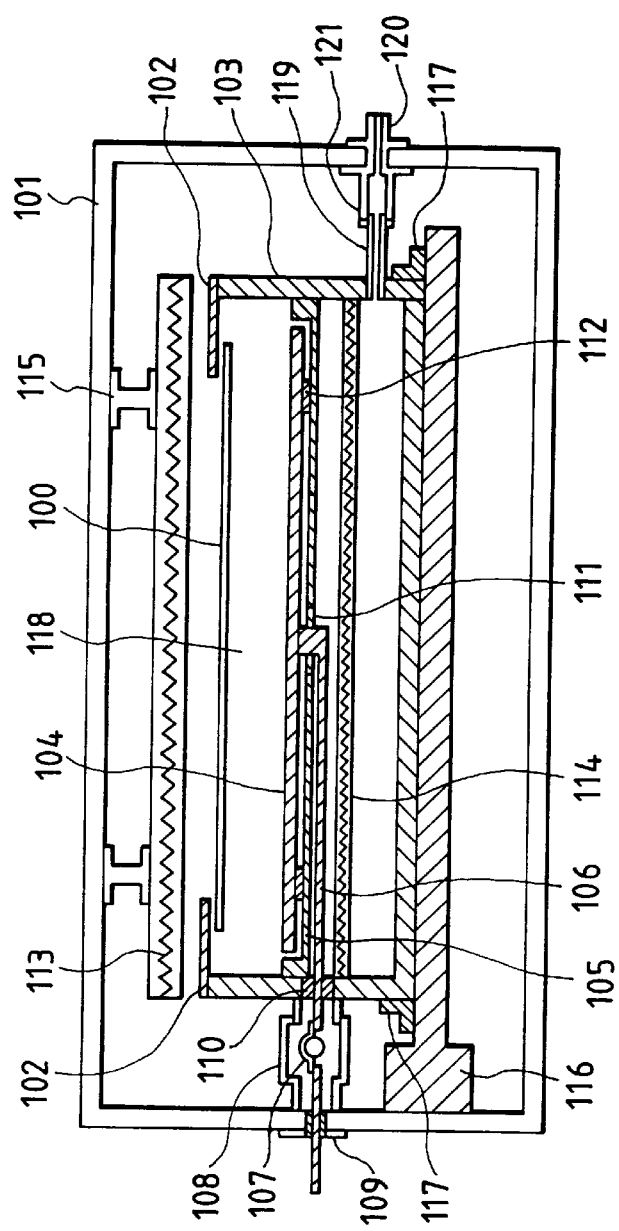
FIG. 17 is a view showing the structure of a vacuum chamber and a film forming chamber in one embodiment of a second film forming apparatus of the present invention.

FIG. 17 is a cross-sectional view showing the structure of vacuum vessel of the second film forming apparatus (plasma CVD film forming apparatus) according to the present invention. Like numerals are used to indicate the same parts as in FIG. 2. The cross-section thereof is orthogonal to the conveying direction of the band-like substrate 100, the band-like substrate being conveyed from the fore side to the rear side on the paper face.

In FIG. 17, 100 is a band-like substrate, 101 is a vacuum vessel, 102 is a ceiling plate, 103 is a film forming chamber, 104 is a discharge electrode, 105 is a gate electrode, 106 is a feeder board, 107 is a juncture, 108 is a shield, 109 is an rf introducing flange, 110 to 112 are insulators, 113 is a substrate heater, 114 is a gas heater, 115 is a heater supporting stay, 116 is a film forming chamber supporting stay, 117 is a position securing metal fitting, 118 is a glow discharge space, 119 is a gas introducing tube, 120 is a gas introducing flange, and 121 is an O-ring.

In FIG. 17, when the vacuum vessel 101 per se is misregistered 5 mm to right in the figure, for example, it follows that the band-like substrate 100 is displaced 5 mm to left in the figure relative to the film forming chamber 103.

Owing to this misregistration, there occurs an interstice in the glow discharge space 118 corresponding to the film forming space, enclosed by the band-like substrate 100, the ceiling plate 102 and the film forming chamber 103, causing leakage of plasma, or contact between the band-like substrate 100 and the film forming chamber 103, resulting in the problem of deforming the band-like substrate 100.

One way to solve the above problem such that the band-like substrate 100 may be located in the center of the film forming chamber 103, after the position securing metal fitting 117 is released and the film forming chamber 103 is moved 5 mm to left in the figure, the position securing metal fitting 117 is placed again. Then, the juncture 107 is subjected to compressive force, but since the juncture 107 is configured to be easily flexed by a flexible member having an elliptic cross-section, it can absorb the displacement caused by the movement of film forming chamber 103.

Also, the gas introducing flange 120 secured to the vacuum vessel 101 and the gas introducing tube 119 secured to the film forming chamber 103 are of the construction having pipes of different inner diameters fitted, and slidable, thereby provided with an easily flexible structure, whereby the gas-introducing tube 119 and the gas introducing flange 120 are slidable to left and right in directions leaving apart from each other, so that the displacement due to the movement of the film forming chamber 103 can be absorbed. Also, they are slidable without leakage of source gases from the fitting portion between the gas introducing tube 119 and the gas introducing flange 120 owing to the O-ring 121.

As above described, the position between the band-like substrate 100 and the film forming chamber 103 can be properly retained by moving the film forming chamber in the horizontal plane.

Then, while the vacuum vessel 101 of the plasma CVD system as shown in FIG. 17 is operating, the juncture 107 will be specifically described below.

When the apparatus is activated, the film forming chamber 103 is heated up to near 300° C. by the heater 113, heater 114, and plasma produced by glow discharge.

On the other hand, the vacuum vessel 101 is subjected to heat radiation from the film forming chamber 103, but the temperature thereof will rise up to near 70° C., due to heat diffusion to the atmosphere or the surroundings.

Therefore, since the film forming chamber 103 is displaced by great heat expansion, the connecting portion between the film forming chamber 103 and the vacuum vessel 101, in particular, the juncture 107 for joining with the feeder board 106 for supplying the RF power to the discharge electrode 104, is subjected to compressive force.

The juncture 107 will be deformed elliptically in cross-section of the juncture 107 and contracted to absorb the displacement.

Since the juncture 107 is constructed of thin plates placed one on the other, the juncture 107 has the increased surface area, with high conductivity of rf, resulting in the enhanced efficiency of feeding power to the discharge electrode.

Figure 18:
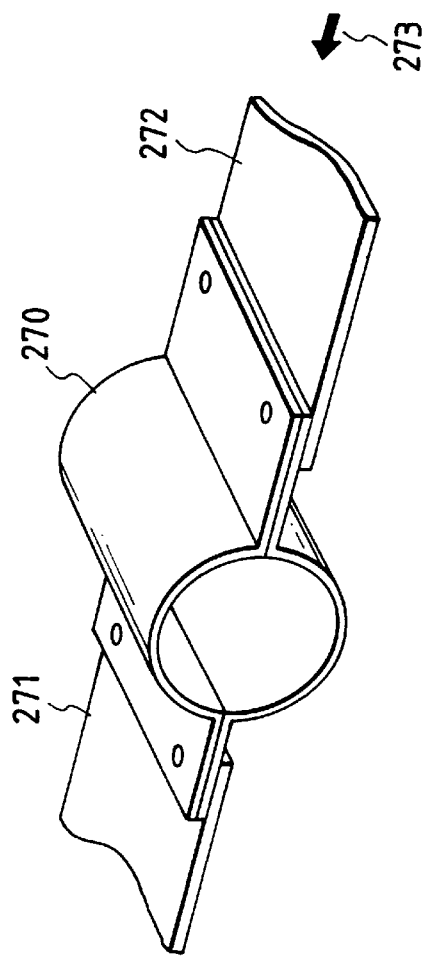
FIG. 18 is a view showing the structure of a joint of a feeder board within the vacuum chamber in one embodiment of the second film forming apparatus of the present invention.

FIG. 18 is a view of the juncture for the feeder board (106 in FIG. 17) for the RF power.

270 is a juncture, 271, 272 are feeding boards, and 273 is a direction of the force applied on the juncture.

If a force is exerted in the direction of the arrow 273 in the figure, a portion of the juncture 270 almost circular in cross-section is easily deformed elliptically. In this way, by making the juncture 270 flexible, the displacement of the feeder board owing to positional adjustment of the film forming chamber, and the displacement of the feeder board due to heat expansion can be absorbed as shape changes of the juncture 270.

Note that a position adjustment mechanism of the film forming chamber (treatment room) within the vacuum vessel (chamber) as above described and shown in FIG. 17 is also applicable to the film forming apparatus having a film forming chamber detachable from the vacuum vessel as shown in FIGS. 4, 5 and 7.

The operation or state of each member in a film forming process for the film forming apparatus (vacuum vessel) of the form as shown in FIG. 17 will be described below.

The film forming chamber 103 contains a guard electrode 105, a feeder board 106, insulators 111, 112, and a gas heater 114. The upper face of the film forming chamber 103 is covered with the ceiling plate 102 and the band-like substrate 100.

On the upper portion of the film forming chamber 103, a substrate heater 113 is disposed. The film forming chamber 103 is connected to a gas inlet tube (not shown) from the outside, and to exhaust means (not shown) outside the film forming chamber 103.

The glow discharge space 118 can be retained at desired pressure by an exhaust speed adjusting mechanism provided on this exhaust means.

The source gases are introduced via the gas introducing tube (not shown) into the film forming chamber 103. The upper face of the film forming chamber 103 is covered with the ceiling plate 102 and the band-like substrate 100, and the band-like substrate 100 is overlapped at both end portions with the ceiling plate 102, to prevent leakage of discharge produced in the glow discharge space 118.

A gas heater 114 is provided within the film forming chamber 103, source gases introduced into the film forming chamber 103, the discharge electrode 104 and the film forming chamber 103 per se are heated by the heater 114.

On the upper portion of another film forming chamber, a substrate heater 113 is provided to heat the band-like substrate 100 to a desired film forming temperature.

RF power is supplied via an RF introducing flange 109, a connecting portion 107 and a power feeding portion 106 into the discharge electrode 104.

The film forming chamber 103 is supported by the film forming chamber support stay 116, and normally secured by a position securing metal fitting 117, but when the position securing metal fitting 117 is loosened, the film forming chamber 103 is movable to left and right in the figure.

The connecting portion 107 is flexible to left and right in the figure, such that the position of the film forming chamber 103 can be adjusted in the horizontal direction, in particular to left and right.

The glow discharge space 118 is a space enclosed by the wall face of the film forming chamber 103, discharge electrode 104, band-like substrate 100 and ceiling plate 102, the band-like substrate 100 is supported by a magnet roller (not shown) and conveyed in front and back directions on the paper face.

The source gases introduced into the glow discharge space 118 are subjected to dissociation by RF power applied between the discharge electrode 104 and the band-like substrate 100, so that the semiconductor film can be continuously deposited on the band-like substrate 100.

The second film forming apparatus of the present invention uses vacuum vessels containing a film forming chamber of the form as shown in FIG. 17, and was applied to, for example, a plasma CVD system of the roll-to-roll type having the structure as shown in FIG. 14. If the apparatus is activated, the band-like substrate 900 (substrate 100 in FIG. 17) is successively formed with desired semiconductor layers in a plurality of film forming chambers 916 to 928, while being continuously conveyed in its longitudinal direction at a constant speed. Finally, the semiconductor layers are laminated on the band-like substrate 900, so that desired semiconductor junction devices can be formed consecutively.

As a result, semiconductor junction devices of large area can be mass produced.

In the following, the experimental results made based on the above-described embodiment will be described below, with specific numeric values given.

EXPERIMENT 5

In a plasma CVD system of roll-to-roll type as shown in FIG. 14, for a case (sample e) where a solar battery of triple cell structure having three pins was fabricated via a film forming process of forming the films on the band-like substrate by the system, using a vacuum vessel 101 having a film forming chamber 103 and a juncture 107, as shown in FIG. 17, for each of the vacuum vessels 902 to 914, with the positional adjustment of the film forming chamber 103 during the film forming process, and a case (sample f) where a solar battery of triple structure was fabricated in the same manner by forming the films on the band-like substrate, using the system with vacuum vessels having a film forming chamber 700 as shown in FIG. 2, without positional adjustment of the film forming chamber 700 during the film forming process, the characteristics of the triple cell fabricated were evaluated and compared.

The film forming conditions adopted are listed in Table 5. In FIG. 14, for convenience sake, the vacuum vessels 901 to 915 are indicated by A to O in this order. The sorts of semiconductor layers formed in the vacuum vessels B to N are n-type layers for B, G, and L, n/i buffer layers for C, and H, i-type layers for D, I, and M, p/i buffer layers for E, and J, and p-type layers for F, K, and N.

First, the experiment of a sample f will be specifically described below. As shown in FIG. 15, at the early stage of installation, the vacuum vessels 901 to 915 were arranged linearly along a center line 950.

In this system, the film formation was conducted with an apparatus (as shown in FIG. 14) having the vacuum vessels as shown in FIG. 2, and under the film forming conditions as listed in Table 5. If a band-like substrate having a total length of one lot of 780 m, is conveyed at a conveying speed of 1270 m/min, continuous film formation for about ten hours for one lot can be effected. After this film formation was repeated for ten lots, there was seen a phenomenon that the arrangement of vacuum vessels was displaced relatively in width direction of the band-like substrate 100. This displacement amount measured for each of the vacuum vessels is graphically represented in FIG. 16. The longitudinal axis indicates the displacement amount in a direction perpendicular to the conveying direction of vacuum vessels on the center line 950 as previously described and shown in FIG. 15, and the transversal axis indicates the position of each vacuum vessel in the conveying direction.

In FIG. 15, if the vacuum vessels 901 to 915 are displaced in a width direction of the band-like substrate 930 (substrate 100 in FIG. 2), the misregistration of the band-like substrate 930 relative to the film forming chambers 916 to 928 takes place. In this state, when making a triple cell by the film formation with that apparatus, there was seen a phenomenon that the interstice occurred in the glow discharge spaces in some of the film forming chambers 916 to 928, during film formation, so that plasma leaks to the outside of the film forming chambers.

Further, on the triple cell structures were formed by vapor deposition a transparent electrode and a collector electrode, thereby completing a solar battery. The evaluation of the resulting solar battery was made by measuring the photoelectric conversion efficiency η when illuminating with artificial sunlight having an AM value of 1.5 and an energy density of 100 mW/cm$^2$, as shown in FIG. 2. The photoelectric conversion efficiency η of the solar battery having an area of 0.25 cm$^2$ in the central portion and both end portions of the band-like substrate (the band-like substrate 100 of FIG. 2) in the width direction is listed in Table 6. Note that the end portion 1 is a right end of the band-like substrate and the end portion 2 is a left end thereof in FIG. 2.

An experiment for sample e will be specifically described below. The internal constitution of a vacuum vessel for an apparatus for fabricating the sample is shown in FIG. 19, the film forming chamber being adjustable in position within the horizontal plane. To eliminate the interstice of the glow discharge space caused by displacement of the vacuum vessel in a film forming process under the conditions as listed in Table 5, the position of the chamber 927 within the vacuum vessel 913 was corrected so that the center of the film forming chamber 927 may be aligned with the center of the band-like substrate 930 in FIG. 15, for example, the central line of the film forming chamber 927 may be arranged along the central line 950. In FIG. 17, the position of the film forming chamber 103 was corrected within the vacuum vessel 101.

Specifically, in FIG. 17, where the vacuum vessel 101 was offset 5 mm to the right in the figure from a predetermined position, a position securing metal fitting 117 was loosened to move the film forming chamber 103 to the left by 5 mm, to correct the center of the film forming chamber 103 to be aligned to the center of the band-like substrate 100.

Then, a compressive force is exerted on the juncture 107, but since the juncture is easily flexible, its displacement due to movement of the film forming chamber 103 can be absorbed, without modification of parts for the juncture.

Since a gas introducing tube 119 and a gas introducing flange 120 are slidable to left and right in the figure, the displacement due to movement of the film forming chamber 103 could be absorbed.

Note that the displacement of the vacuum vessel 101 to the left in FIG. 17 corresponds to a positive displacement in the chart as shown in FIG. 15.

Also, the maximum movable amount of the fitting portion of the juncture 107 and the gas introducing tube 119 with the gas introducing flange 120 is ±10 mm in this example, so that even with a vacuum vessel 910 (J) having the maximum displacement amount measured for e.g. a sample as shown in FIG. 15, the positional adjustment of the film formation chamber 924 can be effected.

As above-described, the positional adjustment of the film forming chamber 103 was made, using a vessel as shown in FIG. 17, and the film formation was conducted under the film forming conditions as listed in Table 5. On a structure of triple cell formed, a transparent electrode and a collector electrode were formed by vapor deposition, thereby completing a solar battery. The results of measuring the photoelectric conversion efficiency η, like the sample e, are listed in Table 6.

As will be clear from the results of Table 6, sample f has a non-uniform distribution of characteristics in the width direction of the band-like substrate, while sample e of the present invention has more uniform distribution of characteristics.

EXPERIMENT 6

A solar battery of a-Si single cell structure was fabricated, using a plasma CVD system of roll-to-roll type having a structure as shown in FIG. 15. An experiment for measuring the time for which the stable discharge can be sustained was repeated ten times, while the system was continuously operated for ten hours at maximum, whereby comparison was made between a case (sample j) where a solar battery was fabricated using the system comprising vacuum vessels with a juncture 107 having the structure as shown in FIG. 17, and a case (sample h) where a solar battery using the system having the structure of a film forming chamber 700 as shown in FIG. 2.

Note that all the layers were formed by RF plasma CVD in this experiment.

The film forming conditions for this experiment were listed in Table 7.

The RF power used had an oscillating frequency of 13.56 MHz. The film forming chamber 505 in the vacuum vessel 501 was deposited with an n-type layer, the film forming chamber 506 in the vacuum vessel 502 with an i-type layer, and the film forming chamber 507 in the vacuum vessel 503 with a p-type layer.

The heater temperature in Table 7 is a temperature of heater 114 in FIGS. 2 and 17.

The apparatus was operated under the film forming conditions to form a single cell. As a result of repeating a continuous operation of the apparatus ten times for a case of making a sample g and a case of making a sample h, the average time when three discharges of the glow discharge spaces 511 to 513 as shown in FIG. 11 were stably sustained is listed in Table 8.

In a process of making a sample h, if the time has elapsed from the excitation of discharge, the trouble such as extinction of discharge or increased reflection power arose, while when making the sample g, the discharge was always stable.

Further, on the single cell structure formed, the transparent electrode and the collector electrode were formed by vapor deposition to complete a solar battery.

The evaluation of the solar battery formed was performed by measuring the photoelectric conversion efficiency η when illuminating with the artificial sunlight having an AM value of 1.5 and an energy density of 100 mw/cm$^2$.

For the central portion of the band-like substrate 100 in the width direction, the photoelectric conversion efficiency η of the solar battery having an area of 0.25 cm$^2$ is listed in Table 8.

As will be clear from the above results, in experiment 6, the discharge of the glow discharge spaces 511 to 513 could be stably operated continuously over ten hours, thereby stably forming pin-type photovoltaic elements of large area.

A first form of the present invention resides in taking out and removing the treatment room such as a film forming chamber from the vacuum chamber in the apparatus for continuously forming the film on the substrate, wherein the maintenance capability and the availability of the apparatus can be greatly enhanced, with reduced costs of the apparatus, by exchanging only the film forming chamber, with a simple operation of taking out and removing the film forming chamber from the vacuum chamber, without spending much time to clean away the powder or film.

Also, in the first form of the present invention, the film forming chamber is connected via a joint having an O-ring with the gas supply portion for supplying this film forming gas, and when the film forming chamber is taken out from the vacuum chamber, or conversely, restored into the vacuum chamber, it can be automatically connected therewith by pulling or pushing, resulting in greater workability.

Further, the film forming chamber is coupled via a connection clamp with an applicator with which electric power is introduced via the power introducing waveguide provided on the side of the film forming chamber into the waveguide provided on the side of the flange in the vacuum chamber, so that the film forming chamber can be pulled out from the vacuum chamber by one touch, resulting in further enhanced maintenance capability.

In the first form of the present invention, since the treatment room can be detached from the vacuum chamber, and a pressure difference between adjacent vacuum chambers can be provided in the state where the band-like substrate is passed through a plurality of vacuum chambers, the gate valve is closed at the time of maintenance, the detachable treatment room can be replaced with a spare room, with the vacuum chamber which requires maintenance being set at atmospheric pressure, or the bobbin for the delivery mechanism or winding mechanism can be replaced with a new one, thereby greatly reducing the maintenance time particularly in the film forming apparatus of roll-to-roll type, and enhancing the availability of the apparatus, with consequent reduced costs of the product.

A second form of the present invention, in the apparatus for continuously forming the film on the substrate, by constructing the introducing portion for RF power and the source gases flexible in one vacuum chamber, when the vacuum vessel is displaced relatively in a horizontal plane, for the reason of repeated heating and cooling of the treatment room such as film forming chamber within the vacuum chamber, the positional adjustment can be made by moving the film forming chamber in the horizontal plane, to eliminate the relative misregistration between the film forming chamber and the band-like substrate, thereby preventing leakage of plasma discharge, and avoiding generation of abnormal (local) discharge, whereby a uniform and homogeneous functional deposited film for the photovoltaic element can be manufactured.

Also, with the above constitution, a functional deposited film for the photovoltaic element can be manufactured with good yield, while avoiding the trouble such as deformation of the band-like substrate, difficulty in conveying the band-like substrate or rupture.

TABLE 1

| | | | | | |
|---|---|---|---|---|---|
| Substrate | SUS430BA | | 350 mm wide | 0.15 mm thick | |
| Reflection layer | Silver (Ag) | | Thin film 100 nm | | |
| Reflection augmenting layer | Zinc gas flow (ZnO) | | Thin film 1 $\mu$m | | |
| Gate gas | $H_2$ from each gate | | 1000 cc/min | | |

| | Layer name | | Used gas flow (cc/min) | Discharge power (W) | Pressure (Torr) | Temperature of substrate (° C.) |
|---|---|---|---|---|---|---|
| Layer fabrication conditions | n-type semiconductor layer | $SiH_4$<br>$PH_3/H_2$ (1% diluted)<br>$H_2$ | 100<br>500<br>700 | 100 (RF) | 1.0 | 290 |
| | n/i diffusion preventing layer | $SiH_4$<br>$H_2$ | 50<br>1000 | 50 (RF) | 1.1 | 270 |
| | i-type semiconductor layer | $SiH_4$<br>$GeH_4$<br>$H_2$ | 50<br>50<br>300 | 200 (microwave) | 0.02 | 310 |
| | p/i diffusion preventing layer | $SiH_4$<br>$GeH_4$<br>$H_2$ | 20<br>7<br>1000 | 50 (RF) | 1.1 | 280 |
| | p-type semiconductor layer | $SiH_4$<br>$BF_3/H_2$ (1% diluted)<br>$H_2$ | 100<br>50<br>1500 | 1000 RF) | 1.0 | 175 |
| | n-type semiconductor layer | $SiH_4$<br>$BF_3/H_2$ (1% diluted)<br>$H_2$ | 50<br>500<br>1000 | 50 (RF) | 1.0 | 270 |
| | n/i diffusion preventing layer | $SiH_4$<br>$H_2$ | 50<br>1000 | 50 (RF) | 1.1 | 250 |
| | i-type semiconductor layer | $SiH_4$<br>$GeH_4$<br>$H_2$ | 45<br>40<br>300 | 180 (microwave) | 0.015 | 290 |
| | p/i diffusion preventing layer | $SiH_4$<br>$GeH_4$ (1% diluted)<br>$H_2$ | 20<br>5<br>1000 | 50 (RF) | 1.1 | 280 |
| | p-type semiconductor layer | $SiH_4$<br>$PH_3/H_2$ (1% diluted)<br>$H_2$ | 100<br>500<br>1500 | 1000 (RF) | 1.0 | 175 |
| | n-type semiconductor layer | $SiH_4$<br>$PH_3/H_2$ (1% diluted)<br>$H_2$ | 100<br>120<br>1500 | 80 (RF) | 1.0 | 270 |
| | i-type semiconductor layer | $SiH_4$<br>$H_2$ | 150<br>1000 | 400 (RF) | 1.1 | 200 |
| | p-type semiconductor layer | $SiH_4$<br>$BH_3/H_2$ (1% diluted)<br>$H_2$ | 10<br>50<br>2500 | 1000 (RF) | 1.0 | 175 |
| | Transparent electrode | ITO ($In_2$ + $SnO_2$) | | Thin film 100 nm | | |

TABLE 1-continued

| | | |
|---|---|---|
| Collector electrode | Aluminum (Al) | Thin film 2 μm |

TABLE 2

| | | | | |
|---|---|---|---|---|
| Substrate | SUS430BA | 300 mm wide | | 0.2 mm thick |
| Reflection layer | Silver (Ag) | Thin film 100 nm | | |
| Reflection augmenting layer | Zinc oxide (ZnO) | Thin film 1 μm | | |
| Gate gas | $H_2$ from each gate | 500 cc/min | | |

| | Layer name | Used gas flow (cc/min) | Discharge power (W) | Pressure (Torr) | Temperature of substrate (° C.) |
|---|---|---|---|---|---|
| Layer fabrication conditions | n-type layer | $SiH_4$ 100<br>$PH_3/H_2$ (1% diluted) 500<br>$H_2$ 700 | 100 (RF) | 1 | 270 |
| | i-type layer | $SiH_4$ 50<br>$GeH_4$ 50<br>$H_2$ 200 | 200 (microwave) | 0.02 | 360 |
| | p-type layer | $SiH_4$ 100<br>$BF_3/H_2$ (1% diluted) 50<br>$H_2$ 1500 | 1000 (RF) | 1.0 | 150 |
| | Transparent electrode | ITO ($In_2$ + $SnO_2$) | Thin film 100 nm | | |
| | Collector electrode | Aluminum (Al) | Thin film 2 μm | | |

TABLE 3

| Items | (b) | (a) | Unit |
|---|---|---|---|
| Treatment | 10.0 | 10.0 | Time |
| Rest Time | 9.1 | 2.3 | Time |
| Breakdown | | | |
| Leak | 0.4 | 0.2 | |
| Cooling of apparatus | 1 | 0.5 | |
| Cleaning of treatment room | 2.5 | 0.5 | |
| Pulling vacuum | 0.2 | 0.1 | |
| Vacuum up by heating | 5.0 | 1.0 | |
| Availability factor | 52 | 81 | % |

TABLE 4

| Items | (b) | (a) | Unit |
|---|---|---|---|
| Treatment | 10.0 | 10.0 | Time |
| Rest Time | 12.1 | 3.1 | Time |
| Breakdown | | | |
| Leak | 1.5 | 0.2 | |
| Cooling of apparatus | 1.5 | 0.5 | |
| Cleaning of treatment room | 3.5 | 0.7 | |
| Pulling vacuum | 0.5 | 0.2 | |
| Vacuum up by heating | 5.0 | 1.5 | |
| Availability factor | 45 | 76 | % |

TABLE 5

| | | | |
|---|---|---|---|
| Substrate | SUS430BA | 350 mm wide | 0.127 mm thick |
| Reflection layer | | Silver (Ag) | Thin film 50 nm |
| Reflection augmenting layer | | Zinc Oxide (ZnO) | Thin film 1 μm |
| Gate gas | | $H_2$ from each gate | 1000 cc/min |

| Layer name | Used gas flow (cc/min) | Discharge power (W) | Pressure (Torr) | Temperature of substrate (° C.) |
|---|---|---|---|---|

TABLE 5-continued

| | Layer name | Used gas | Flow (cc/min) | Discharge power (W) | Pressure (Torr) | Temperature (°C) |
|---|---|---|---|---|---|---|
| Layer fabrication conditions | n-type layer | $SiH_4$<br>$PH_3/H_2$ (1% diluted)<br>$H_2$ | 100<br>400<br>700 | 100 (RF) | 1.0 | 290 |
| | n/i buffer layer | $SiH_4$<br>$H_2$ | 50<br>1000 | 50 (RF) | 1.05 | 270 |
| | i-type layer | $SiH_4$<br>$GeH_4$<br>$H_2$ | 50<br>50<br>200 | 150 (microwave) | 0.01 | 300 |
| | p/i buffer layer | $SiH_4$<br>$GeH_4$<br>$H_2$ | 20<br>7<br>1000 | 50 (RF) | 1.05 | 280 |
| | p-type layer | $SiH_4$<br>$BF_3/H_2$ (1% diluted)<br>$H_2$ | 100<br>50<br>2000 | 1200 (RF) | 1.0 | 175 |
| | n-type layer | $SiH_4$<br>$BF_3/H_2$ (1% diluted)<br>$H_2$ | 50<br>500<br>1500 | 50 (RF) | 1.0 | 270 |
| | n/i buffer layer | $SiH_4$<br>$H_2$ | 50<br>1000 | 50 (RF) | 1.05 | 250 |
| | i-type layer | $SiH_4$<br>$GeH_4$<br>$H_2$ | 45<br>40<br>300 | 150 (microwave) | 0.015 | 290 |
| | p/i buffer layer | $SiH_4$<br>$GeH_4$<br>$H_2$ | 20<br>5<br>1000 | 50 (RF) | 1.05 | 280 |
| | p-type layer | $SiH_4$<br>$PH_3/H_2$ (1% diluted)<br>$H_2$ | 100<br>500<br>2000 | 1200 (RF) | 1.0 | 175 |
| | n-type layer | $SiH_4$<br>$PH_3/H_2$ (1% diluted)<br>$H_2$ | 100<br>120<br>1500 | 80 (RF) | 1.0 | 270 |
| | i-type layer | $SiH_4$<br>$H_2$ | 150<br>1000 | 400 (RF) | 1.2 | 250 |
| | p-type layer | $SiH_4$<br>$BH_3/H_2$ (1% diluted)<br>$H_2$ | 10<br>50<br>4000 | 1500 (RF) | 1.0 | 175 |
| | Transparent electrode | ITO ($In_2$ + $SnO_2$) | Thin film 100 nm | | | |
| | Collector electrode | Aluminum (Al) | Thin film 2 μm | | | |

TABLE 6

| | Photoelectric conversion efficiency η | | |
|---|---|---|---|
| | End portion 1 | Central portion | End portion 2 |
| Sample e | 12.1% | 12.0% | 12.1% |
| Sample f | 12.3% | 12.0% | 11.3% |

TABLE 8

| | Discharge duration (average value of 10 times) | Optical photoelectric efficiency η (average value of 10 times) |
|---|---|---|
| Sample g | 10 hours | 5.6% |
| Sample h | 3.5 hours | 5.5% |

TABLE 7

| | | | |
|---|---|---|---|
| Substrate | SUS430BA | 300 mm wide | 0.2 mm thick |
| Reflection layer | Silver (Ag) | Thin film 100 nm | |
| Reflection augmenting layer | Zinc Oxide (ZnO) | Thin film 1 μm | |
| Gate gas | $H_2$ from each gate | 500 cc/min | |

| Layer name | Used gas flow (cc/min) | Discharge power (W) | Pressure (Torr) | Temperature of substrate (°C) | Temperature of heater (°C) |
|---|---|---|---|---|---|

TABLE 7-continued

| Layer fabrication conditions | n-type layer | SiH$_4$<br>PH$_3$/H$_2$ (1% diluted)<br>H$_2$ | 100<br>700<br>1000 | 100 (RF) | 1.0 | 270 | 300 |
|---|---|---|---|---|---|---|---|
| | i-type layer | SiH$_4$<br>GeH$_4$<br>H$_2$ | 50<br>50<br>200 | 200<br>200 (RF)<br>200 | 1.2 | 230 | 300 |
| | p-type layer | SiH$_4$<br>BF$_3$/H$_2$ (1% diluted)<br>H$_2$ | 10<br>100<br>1000 | 2000 RF) | 1.0 | 150 | 70 |
| | Transparent electrode | ITO (In$_2$ + SnO$_2$) | Thin film 100 nm | | | | |
| | Collector electrode | Aluminum (Al) | Thin film 2 μm | | | | |

What is claimed is:

1. A film forming method using an apparatus with a plurality of vacuum chambers in communication to each other via a connection, having internally a detachable treatment room including the steps of:

forming continuously a plurality of films on a band-shaped substrate within the treatment rooms, while continuously moving said substrate through said treatment rooms; and replacing one or more treatment rooms by removing said treatment rooms within said desired vacuum chambers, and attaching another treatment room therefore, after said step of forming the film for a predetermined period.

2. A film forming method using an apparatus with a plurality of vacuum chambers in communication to each other via a connection having a gate valve settable with a pressure difference between adjacent vacuum chambers, having internally a detachable treatment room, including the steps of:

forming continuously a plurality of films on a band-like substrate within the treatment rooms, while continuously moving said substrate through said treatment rooms; and replacing said treatment rooms within said desired vacuum chambers in a state where only desired vacuum chambers are set at atmospheric pressure by closing predetermined gate valves, after said step of forming the film for a predetermined period.

* * * * *